United States Patent
Machida et al.

(10) Patent No.: US 7,188,525 B2
(45) Date of Patent: Mar. 13, 2007

(54) ANGULAR VELOCITY SENSOR

(75) Inventors: Atsushi Machida, Suzaka (JP); Suguru Warashina, Kawasaki (JP); Hiroshi Ishikawa, Kawasaki (JP); Tsutomu Miyashita, Kawasaki (JP); Yoshio Satoh, Kawasaki (JP)

(73) Assignees: Fujitsu Limited, Kawasaki (JP); Fujitsu Media Devices Limited, Suzaka (JP)

( * ) Notice: Subject to any disclaimer, the term of this patent is extended or adjusted under 35 U.S.C. 154(b) by 140 days.

(21) Appl. No.: 10/126,750

(22) Filed: Apr. 22, 2002

(65) Prior Publication Data

US 2003/0066350 A1   Apr. 10, 2003

(30) Foreign Application Priority Data

Oct. 9, 2001   (JP)   ............................. 2001-311096
Feb. 15, 2002  (JP)   ............................. 2002-039128

(51) Int. Cl.
*G01P 9/04*   (2006.01)
(52) U.S. Cl. .................................. 73/504.16
(58) Field of Classification Search ............. 73/504.15, 73/504.16
See application file for complete search history.

(56) References Cited

U.S. PATENT DOCUMENTS

| | | | | |
|---|---|---|---|---|
| 5,056,366 A | * | 10/1991 | Fersht et al. ............. | 73/504.15 |
| 5,444,639 A | * | 8/1995 | White ..................... | 73/504.16 |
| 5,796,000 A | * | 8/1998 | Fujiu et al. ............. | 73/504.15 |
| 5,987,987 A | * | 11/1999 | Watarai .................... | 73/504.16 |
| 6,010,919 A | | 1/2000 | Matsuhiro et al. | |
| 6,119,518 A | | 9/2000 | Itou et al. | |
| 6,177,756 B1 | * | 1/2001 | Yachi et al. ............. | 73/504.16 |

FOREIGN PATENT DOCUMENTS

| | | | |
|---|---|---|---|
| EP | 298511 A2 | * | 1/1989 |
| EP | 309963 A2 | * | 4/1989 |
| EP | 0 441 020 A1 | | 8/1991 |
| EP | 0 638 783 A1 | | 2/1995 |
| EP | 0 642 216 A1 | | 3/1995 |
| EP | 0 649 002 A1 | | 4/1995 |
| EP | 1 085 654 A2 | | 3/2001 |
| EP | 1 152 215 A1 | | 11/2001 |
| JP | 7-159180 | | 6/1995 |
| JP | 2000-213940 | | 8/2000 |
| JP | 2001-116551 | | 4/2001 |
| JP | 2001-165664 | | 6/2001 |

OTHER PUBLICATIONS

European Search report dated Jan. 2, 2006.

* cited by examiner

*Primary Examiner*—Hezron Williams
*Assistant Examiner*—Nashmiya Fayyaz
(74) *Attorney, Agent, or Firm*—Westerman, Hattori, Daniels & Adrian, LLP.

(57) ABSTRACT

An angular velocity sensor is provided that includes a frame, an oscillator and torsion bars that connect the oscillator to the frame. The frame, the oscillator and the torsion bar are formed integral with each other by etching a material substrate in the thickness direction of the substrate. The oscillator, configured in the form of an H, includes a support, two first arms and two second arms. These arms extend from the support in an arm-extending direction perpendicular to the thickness direction of the substrate. The oscillator includes a mounting surface that is provided with a piezoelectric driver for generating in-plane oscillation of the oscillator, and with a piezoelectric detector for detecting out-of-plane oscillation of the oscillator.

15 Claims, 27 Drawing Sheets

ANGULAR VELOCITY SENSOR

BACKGROUND OF THE INVENTION

1. Field of the Invention

The present invention relates to an angular velocity sensor for detecting the angular velocity of a rotating subject.

2. Description of the Related Art

In recent years, angular velocity sensors based on the oscillation gyroscope are used widely in such technical fields as hand tremor detection in video camera, and self-contained driving system in car navigation. In the field of angular velocity sensor itself, automobile driving stability control is a hot field of application, where a highly miniaturized, accurate and reliable angular velocity sensor is in strong demand for use in a vehicle skid prevention system, a vehicle attitude control system for smooth driving on a curved road and so on.

Conventional piezoelectric angular velocity sensors can be classified into two types according to the shape of oscillator, i.e., beam type and fork type. FIGS. 26A and 26B show an angular velocity sensor 800 as a conventional beam type angular velocity sensor. FIG. 26A is a perspective view of the angular velocity sensor 800, whereas FIG. 26B is a sectional view taken along lines B1—B1 in FIG. 26A. The angular velocity sensor 800 includes a beam-shaped or rectangular-parallelepiped oscillator 810, supporting wires 820 for fixing the oscillator to an unillustrated supporting member, a driving piezoelectric element 830, and a pair of detecting piezoelectric elements 840. The oscillator 810 is made of an constant-elasticity metal such as elinvar, and is grounded. The supporting wires 820 are a piano wire for example. The driving piezoelectric element 830 includes a piezoelectric member 831 formed on the oscillator 810, and an electrode 832. The detecting piezoelectric elements 840, each including a piezoelectric member 841 formed on the oscillator 810 and an electrode 842, are disposed on two surfaces which are vertical to the surface provided with the driving piezoelectric element 830. Each of the piezoelectric members 831, 841 is made of piezoelectric ceramic.

When AC voltage is applied to the driving piezoelectric element 830 of the sensor 800, the piezoelectric member 831 expands and shrinks alternately (the reverse piezoelectric effect), causing the oscillator 810 to undergo bending oscillation along the X-axis. Under this condition, if the oscillator 810 is rotated about the Z-axis at an angular velocity of $\omega$, the oscillator 810 comes under the Coriolis force F (F=-2mV$\omega$, where m represents the mass of oscillator, and V represents the speed of oscillation) acting along the Y-axis. This causes the oscillator 810 to oscillate also along the Y-axis. In other words, the bending oscillation of the oscillator 810 is now a combined oscillation including an X-axis component and a Y-axis component. The oscillator 810 under the combined oscillation has distortion in its planes vertical to the Y-axis, which is detected on the basis of the piezoelectric effect acting on the piezoelectric members 841 of the detecting piezoelectric elements 840. The piezoelectric elements 840 give an output proportional to the Coriolis force F or the angular velocity $\omega$.

FIG. 27 shows a conventional fork type angular velocity sensor 900. The angular velocity sensor 900 includes a fork-shaped oscillator 910, a driving piezoelectric element 920, and a pair of detecting piezoelectric elements 930. The oscillator 910, made of a constant-elasticity metal such as elinvar, includes a crotch 911 and two arms 912, 913. The arm 912 includes a driving plate 912a and a detecting plate 912b. The arm 913 includes a driving plate 913a and a detecting plate 913b. The driving piezoelectric element 920 is provided in the driving plate 912a of the driving arm 912, and includes a piezoelectric member 921 and an electrode 922. The pair of detecting piezoelectric elements 930, each including a piezoelectric member 931 and an electrode 932, are provided in the detecting plates 912b, 913b.

In the angular velocity sensor 900 having the above-described construction, when AC voltage is applied to the driving piezoelectric element 920, the arm 912 and the arm 913 oscillate like a tuning fork along the X-axis as indicated by arrows in the Figure. When the oscillator 910 is rotated about the Z-axis at an angular velocity of $\omega$ in this condition, the oscillator 910 comes under the Coriolis force F as expressed by the equation given above acting along the Y-axis. This causes the arms 912, 913 to oscillate also along the Y-axis. The arms 912, 913 under the combined oscillation have distortion in their planes perpendicular to the Y-axis. This distortion is detected based on the piezoelectric effect on the piezoelectric elements 930. The output to be obtained is proportional to the Coriolis force F or the angular velocity $\omega$.

However, according to the conventional beam type angular velocity sensor 800, it is necessary to separately make the oscillator 810 and a supporting member (not illustrated) for supporting the oscillator via the wires 820. After the separate fabrication, these two components must be assembled by spot welding, adhesive and so on. Unfavorably, such structural complexity reduces the manufacturing efficiency of the sensor 800. This holds for the conventional fork type angular velocity sensor 900. Specifically, it is difficult to assemble the driving plates 912a~913a and the detecting plates 912b~913b into the oscillator 910, as required. Also, it is difficult to form the piezoelectric elements 920, 930 on the oscillator 910 efficiently.

The Japanese Patent Laid-Open No. 2001-116551, for example, discloses a technique, in which a fork type oscillator and a support are made separately, and then bonded together with e.g. an adhesive to assemble an angular velocity sensor. As other examples, the Japanese Patent Laid-Open No. 2000-213940 and the Japanese Patent Laid-Open No. 2001-165664 each discloses an angular velocity sensor including an oscillator made of a piezoelectric material. In these angular velocity sensors, the electrodes are provided in oscillator side surfaces which are perpendicular to each other. This arrangement increases the number of manufacturing steps, as well as making the steps complicated, posing a problem of poor productivity. As another example, the Japanese Patent Laid-Open No. 7-159180 discloses an oscillator formation technique, in which a specific crystal surface of monocrystal silicon is used to perform an anisotropic etching in an inclining direction toward a silicon substrate surface. However, this technique is difficult in controlling the etching, and therefore, has problems in reproducibility and productivity.

THE SUMMARY OF THE PRESENT INVENTION

The present invention has been proposed under these circumstances, and it is an object of the present invention to solve or reduce the above conventional problems and to provide an angular velocity sensor which is superior in productivity, small in size and high in performance.

According to a first aspect of the present invention, there is provided an angular velocity sensor that includes: a frame; an oscillator; and a first torsion bar that connects the oscillator to the frame. The frame, the oscillator and the torsion bar are formed integral with each other by etching a material substrate in a thickness direction of the substrate. The oscillator has an H-like form made up of a support, a pair of first arms and a pair of second arms, wherein the first arms extend from the support in an arm-extending direction perpendicular to the thickness direction of the substrate, while the second arms extend from the support oppositely to the first arms. The oscillator includes a mounting surface that is provided with a piezoelectric driver for generating in-plane oscillation of the oscillator, and with a piezoelectric detector for detecting out-of-plane oscillation of the oscillator.

With the above arrangement, an angular velocity sensor is obtainable which is superior in productivity, small in size and high in performance. According to the angular velocity sensor by the present invention, the substrate is etched, so that the frame, the oscillator, and the torsion bar for joining these are integrally formed. Therefore, amicro-machining technique using e.g. reactive ion etching (RIE) to a silicon substrate can be employed, and a three-dimensional microstructure including the frame, the oscillator and the torsion bar can be integrally formed. Then, other etching processes for forming necessary parts can be performed for a plurality of angular velocity sensors at one time on a silicon wafer, in a batch method. This results in mass production of the angular velocity sensor, and improvement in productivity. Further, the driving piezoelectric element and the detecting piezoelectric elements are all provided in the mounting surface of the oscillator. Therefore, the formation of the driving piezoelectric element and the detecting piezoelectric elements, which can be achieved by e.g. vapor deposition, spattering, printing and so on, should be performed only on one surface of the H-shaped oscillator. In other words, there is no need for forming e.g. a piezoelectric film and an electrodes, on any other surfaces such as a side surface of the H-shaped oscillator. Thus, the angular velocity sensor can be made in a relatively simple process, which facilitates improvement in productivity and reliability of the angular velocity sensor. Further, the H-shaped oscillator can be easily supported at its steady point, without affecting the oscillation as seriously as in the beam type oscillator and the fork type oscillator. For this reason, in detecting the Coriolis force that acts on the oscillator, the H-shaped oscillator is able to distort more sensitively than the beam type oscillator and the fork type oscillator. Thus, it becomes possible to make a small, high-performance angular velocity sensor highly productively, by means of micro machining techniques based on semiconductor manufacturing technology.

Preferably, the oscillator is symmetrical with respect to each of two imaginary planes which are parallel to the arm-extending direction and perpendicular to each other.

Preferably, the piezoelectric driver is provided on the first arms, while the piezoelectric detector is provided on the second arms. The piezoelectric driver maybe provided at a crotch defined by the paired first arms and the support.

Preferably, the piezoelectric driver includes a plurality of driving piezoelectric elements disposed symmetrically with respect to an imaginary line extending in the arm-extending direction.

Preferably, at least one of the piezoelectric driver and the piezoelectric detector includes a piezoelectric film and a pair of electrodes sandwiching the piezoelectric film, wherein the piezoelectric film is formed by one of vapor deposition, spattering and printing.

Preferably, at least one of the piezoelectric driver and the piezoelectric detector includes a piezoelectric member and a pair of electrodes sandwiching the piezoelectric member, wherein the piezoelectric member is formed by mechanical processing.

Preferably, the substrate is a low-resistance substrate. In this case, at least one of the piezoelectric driver and the piezoelectric detector is provided on the oscillator via an insulating film. Alternatively, the substrate is a high-resistance substrate. In this case, at least one of the piezoelectric driver and the piezoelectric detector is provided directly on the oscillator without an insulator.

Preferably, the arm-extending direction is parallel to the frame. Further, the paired first arms are spaced from each other by a first distance, the paired second arms spaced from each other by a second distance, the first arms spaced from the frame by a third distance, and the second arms spaced from the frame by a fourth distance. The first, second, third and fourth distances are equal to each other.

Preferably, the angular velocity sensor of the present invention may further include a wiring pattern extending on the frame and the torsion bar to connect to at least one of the piezoelectric driver and the piezoelectric detector.

Preferably, the substrate is provided with a driving circuit electrically connected to the piezoelectric driver, and with a detecting circuit electrically connected to the piezoelectric detector.

Preferably, each of the first arms and the second arms has a tip formed with a thick region. Each of the first arms and the second arms may have a tip provided with a weight.

Preferably, the first and the second arms are shorter than the support in the arm-extending direction.

Preferably, the torsion bar connects the support of the oscillator and the frame to each other.

Preferably, the torsion bar has a thickness no greater than a thickness of the substrate.

Preferably, the torsion bar has a cross section perpendicular to a longitudinal direction of the torsion bar, wherein the cross section is symmetrical with respect to two lines perpendicular to each other.

Preferably, the sensor of the present invention may further include a second torsion bar that connects the oscillator to the frame, wherein the first and the second torsion bars in combination have a center of gravity that coincides with the center of gravity of the oscillator.

According to a second aspect of the present invention, there is provided a method of making an angular velocity sensor that includes an H-like oscillator provided with a pair of first parallel arms and a pair of second parallel arms, the sensor also including a frame that supports the oscillator via a torsion bar. The method includes the steps of: forming a resist pattern on a material substrate; and etching the substrate via the resist pattern. The resist pattern includes a primary resist and an etching control resist, wherein the primary resist is formed with an opening in which the etching control resist is disposed. The etching control resist is spaced from the primary resist by a constant distance.

Preferably, the primary resist masks a substrate portion corresponding to the frame, the oscillator and the torsion bar, while the etching control resist masks another substrate portion between the frame and the oscillator.

Preferably, the above-mentioned constant distance is equal to a distance by which the first arms are spaced from each other.

Preferably, the resist pattern includes a connecting portion that connects the etching control resist to the primary resist.

Other features and advantages of the present invention will become apparent from the detailed description given below with reference to the accompanying drawings.

DETAILED DESCRIPTION OF THE PREFERRED EMBODIMENTS

Figure 1:
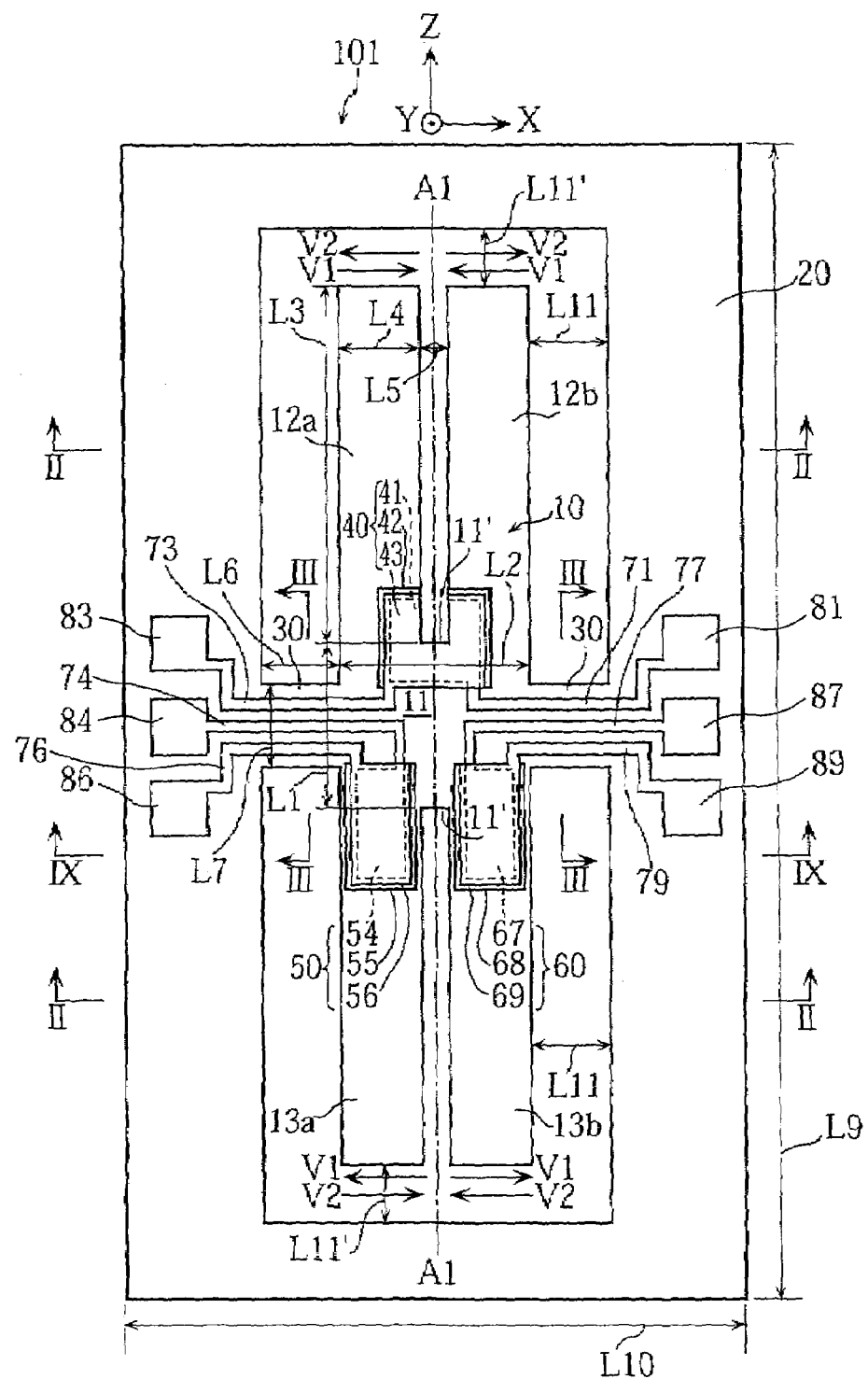
FIG. 1 is a plan view of an angular velocity sensor according to a first embodiment of the present invention.

FIGS. 1 and 3A~3C show an angular velocity sensor 101 according to a first embodiment of the present invention. FIG. 1 is a plan view of the angular velocity sensor 101. FIGS. 2(A~C) and FIGS. 3(A~C) are sectional view taken along lines II—II and III—III in FIG. 1, respectively.

As shown in FIG. 1, the angular velocity sensor 101 includes an H-shaped oscillator 10, a frame 20, a pair of torsion bars 30, a driving piezoelectric element 40 and a pair of detecting piezoelectric elements 50, 60 provided in the H-shaped oscillator 10. The H-shaped oscillator 10, the frame 20 and the torsion bars 30 are formed integrally from a material substrate i.e., a silicon substrate, by reactive ion etching (RIE) or crystalline anisotropic etching. Specifically, the silicon substrate, which has a thickness of 500 μm, has its one surface masked with an etching mask formed as a film of a photo resist or a metal, and then Deep-RIE is performed on the surface via the etching mask. Alternatively, the silicon substrate has both of its surfaces masked by respective etching masks provided by a photo resist or a metal film, and then crystalline anisotropic etching is performed on the surfaces via the etching masks. According to the present invention, if the Deep-RIE is used, the Bosh process, in which the etching is alternated with sidewall protection, is performed in the following manner. Specifically, the etching with $SF_6$ gas is performed for about 8 seconds, which is then followed by the sidewall protection with $C_4F_8$ gas performed for about 7 seconds, with a bias power applied to the wafer being about 20 W. If the crystalline anisotropic etching, which is a wet etching, is used, the etching solution to be used is EPW (ethylene diamine+pyrocatechol+water), or water solution of KOH and so on.

The H-shaped oscillator 10 includes a support 11, a pair of first arms 12a, 12b, and a pair of second arms 13a, 13b extending from the support 11 in a reverse direction as do the first arms 12a, 12b. According to the present embodiment, the support 11 has, for example, a length L1 of 1000 μm, a width L2 of 1100 μm, and a thickness of 500 μm which is the same as of the material substrate. The pair of first arms 12a, 12b are identical with each other in their shape, each having a length L3 of 2500 μm, a width L4 of 500 μm, and a thickness of 500 μm which is the same as of the material substrate, and extend in parallel to each other, being spaced from each other by a distance L5 of 100 μm. Likewise, the pair of second arms 13a, 13b are identical with each other in their shape, each having a length L3 of 2500 μm, a width L4 of 500 μm, and a thickness of 500 μm which is the same as of the material substrate, and extend in parallel to each other, being spaced from each other by a distance L5 of 100 μm. As shown in FIG. 1 and FIGS. 2A~2C, the H-shaped oscillator 10 is highly symmetrical with respect to a plane of symmetry A1—A1 which is a plane parallel to the arm extending directions, and with respect to a plane of symmetry A2—A2 which is a plane parallel to the arm extending directions and vertical to the plane of symmetry A1—A1.

Figure 2A:
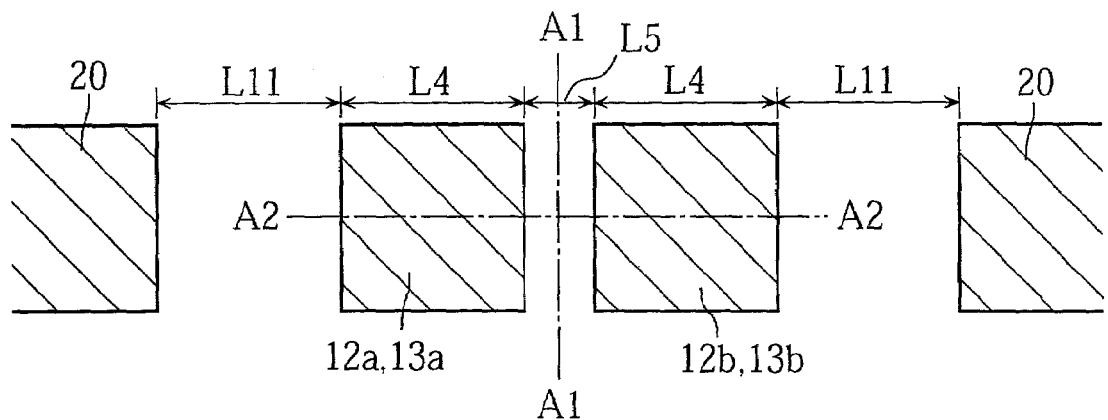
FIGS. 2A~2C are partial sectional views taken in lines II—II in FIG. 1.
Figure 2B:
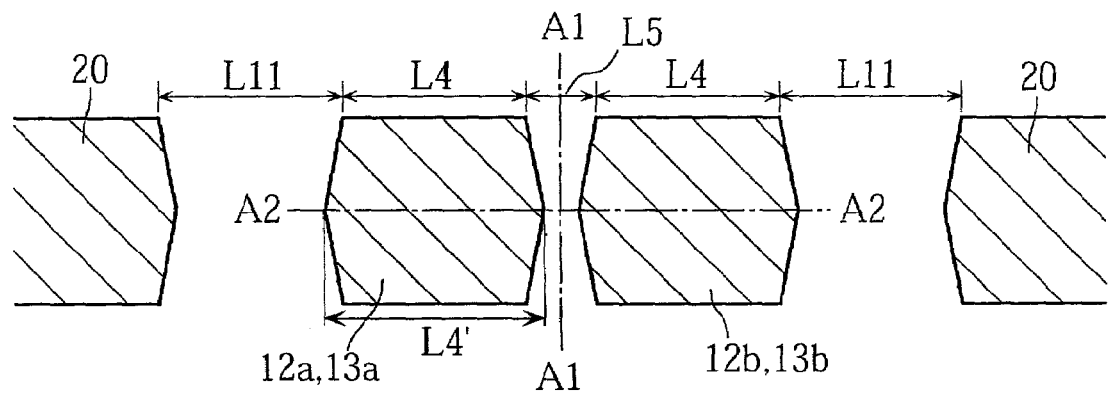

If the single-surface etching by Deep-RIE is used for the integral formation from the material substrate, the first arms 12a, 12b and the second arms 13a, 13b can be formed to have a square section as shown in FIG. 2A. On the other hand, if the two-surface etching by crystalline anisotropic etching is used, the section can be made into a hexagon as shown in FIG. 2B. In the case where the arms has the hexagonal section, the arm width L4 refers to a surface width, and thus the first arms 12a, 12b and the second arms 13a, 13b have a maximum width L4' which is greater than the surface width L4. If the crystalline anisotropic etching is performed to a surface (100) of a silicon substrate to give the surface width L4 of 500 µm, the maximum width L4' will be greater than the surface width L4 by about 350 µm. Since the arms can be made to have a symmetrical section such as a square and a hexagon, it becomes possible to reduce drift according to the H-shaped oscillator 10.

Figure 3A:
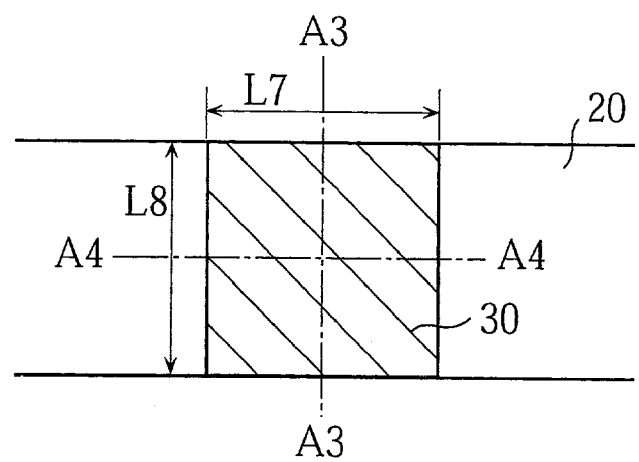
FIGS. 3A~3C are sectional views taken in lines III—III in FIG. 1.
Figure 3B:
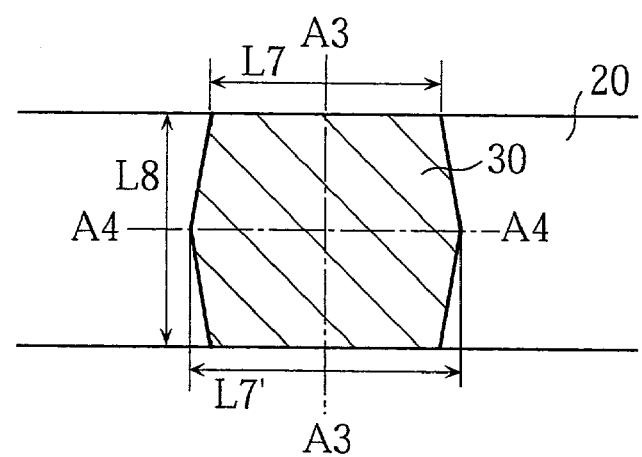
Figure 3C:
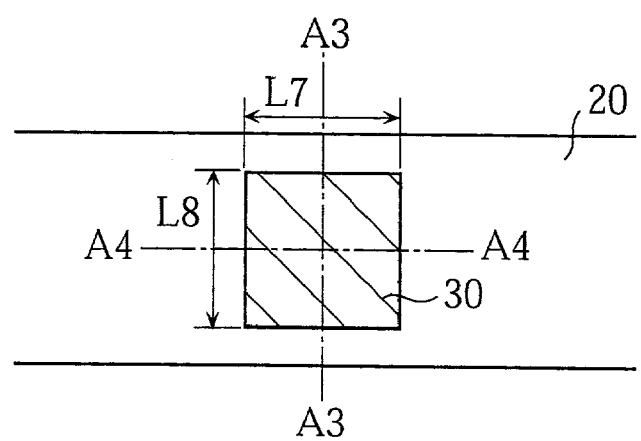

As shown in FIG. 1, the pair of torsion bars 30 each connects with the H-shaped oscillator 10 at the support 11, i.e., at a center in the arm extending directions of the H-shaped oscillator. According to the present embodiment, the torsion bars 30 have, for example, a length L6 of 500 µm, a width L7 of 500 µm, and a thickness L8 of 500 µm. If the single-surface etching by Deep-RIE is used for the integral formation from the material substrate, the torsion bars 30 can be formed to have a square section as shown in FIG. 3A. On the other hand, if the two-surface etching by crystalline anisotropic etching is used, the section can be made into a hexagon as shown in FIG. 3B. In the case where the torsion bars have the hexagonal section, the arm width L7 refers to a surface width, and thus the torsion bars 30 have a maximum width L7' which is greater than the surface width L7. If the crystalline anisotropic etching is performed to the surface (100) of the silicon substrate to give the surface width L7 of 500 µm, the maximum width L7' will be greater than the surface width L7 by about 350 µm. In view of strength, the torsion bars 30 should preferably have a symmetrical section with respect to two mutually perpendicular axes A3—A3, A4—A4 each passing the center of the section. Further, according to the present invention, as shown in FIG. 3C, the torsion bars 30 have a smaller section in order to reduce torsional resistance of the torsion bars 30. Specifically, the width L7 of the torsion bars 30 is reduced, whereas the thickness L8 is reduced to be thinner than the thickness 500 µm of the material substrate. The shape of the torsion bars 30 has a major influence on the sensitivity of the sensor. According to the present invention, the torsional resistance of the torsion bars 30 can be reduced by making the thickness of the torsion bars 30 equal to or thinner than the thickness of the substrate, and as a result, an improved sensitivity of the H-shaped oscillator 10 can be achieved. Further, the torsion bars 30 have a square or hexagonal section and a reduced thickness. In addition, the pair of torsion bars 30 has its center of gravity coinciding with the center of gravity of the H-shaped oscillator 10 located at the support 11. These arrangements contribute to an decrease in the torsional resistance and to maintaining bending strength of the torsion bars 30, whereby the sensitivity of the H-shaped oscillator is improved. Further, these arrangements decrease drift in the H-shaped oscillator 10, which is advantageous to providing a high performance angular velocity sensor 101.

The frame 20, according to the illustrated embodiment, has a length L9 of 7000~9000 µm in the arm extending directions, and a width L10 of 3100~4100 µm. According to the embodiment, as shown in FIG. 2A and FIG. 2B, the first arms 12a, 12b and the second arms 13b, 13b are spaced from the frame 20 by a distance L11 of 500 µm, which is equal to the length L6 of the torsion bars 30. The first arms 12a, 12b are spaced from each other by a distance L5 of 100 µm. As shown in FIG. 1, tips of the first arms 12a, 12b and the second arms 13a, 13b are each spaced from the frame 20 by a distance L11' of 500 µm.

Figure 4:
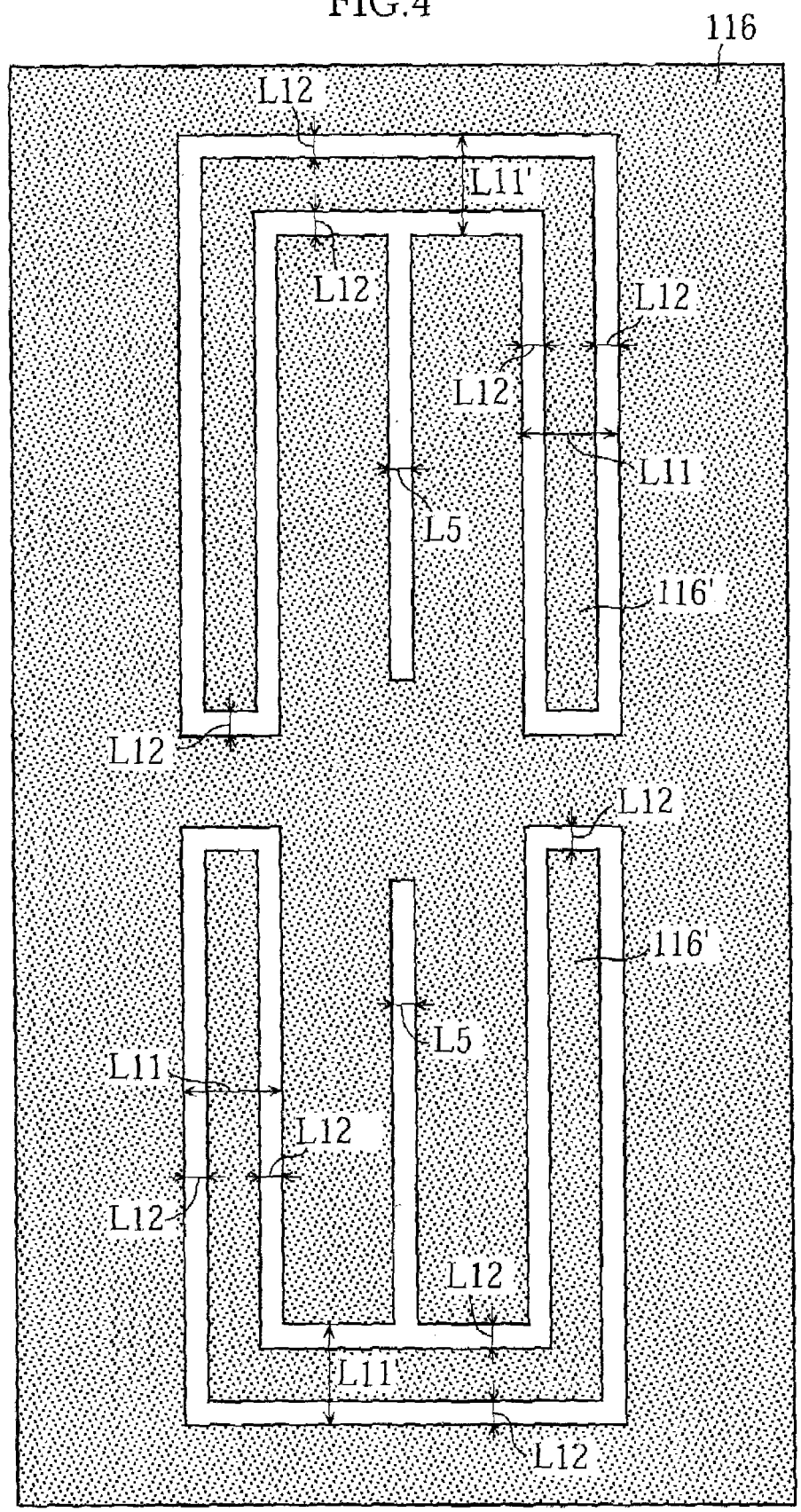
FIG. 4 shows a resist pattern having an etching width adjusting resist pattern.
Figure 5:
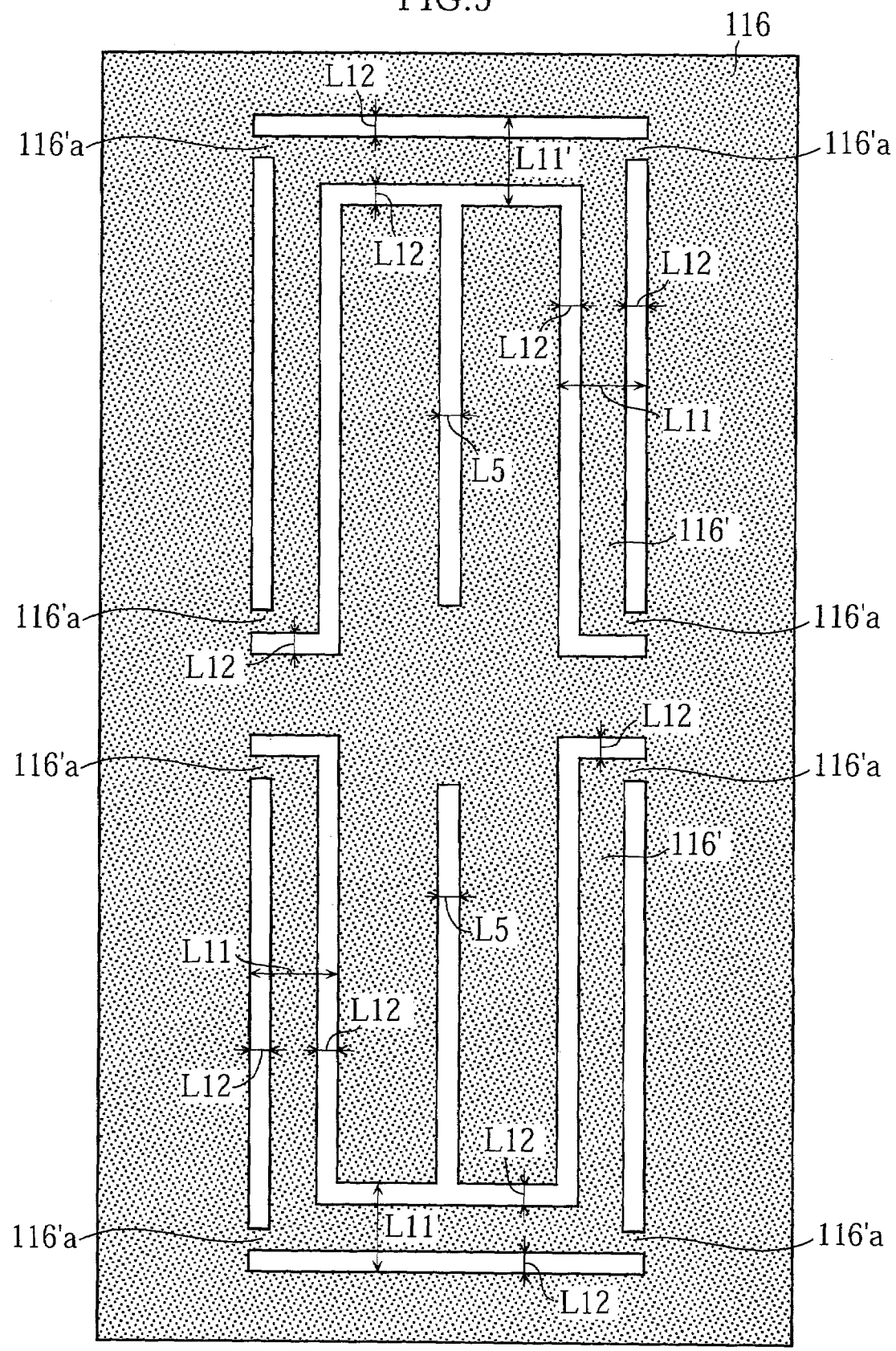
FIG. 5 shows another resist pattern having an etching width adjusting resist pattern.

Thus, the arm-to-arm distance L5 in the pair of arms differs from the arm-to-frame distance L11, L11'. With this design, it is preferable, as shown in FIG. 4 and FIG. 5, to use a resist pattern (which includes a resist pattern 116 and an etching width adjusting resist pattern 116') in etching the material substrate (to be described later with reference to FIGS. 10C, 11B and 11E). The resist pattern 116 is to mask a region of the material substrate to be formed into the H-shaped oscillator 10, the frame 20 and the torsion bars 30. The etching width adjusting resist pattern 116' is spaced from the resist pattern 116 by a predetermined distance. FIG. 4 shows a case in which the etching width adjusting resist pattern 116' is independent of the resist pattern 116. FIG. 5 show a case in which the etching width adjusting resist pattern 116' is connected, via its bridges 116'a, with the resist pattern 116. The resist pattern 116 is spaced from the etching width adjusting resist pattern 116' by a distance L12 of e.g. 100 µm, which is equal to the arm-to-arm distance L5 in the pair of arms. As described, the arm-to-arm distance L5 in each pair of the arms differs from the arm-to-frame distances L11, L11'. However, by preparing the resist pattern that includes the resist pattern 116 and the etching width adjusting resist pattern 116' as shown in FIG. 4 and FIG. 5, it becomes possible to etch at a same etching rate in the etching for forming each relevant component. As a result, inconsistency in the sectional shape of the frame 20, the first arms 12a, 12b, and the second arms 13a, 13b can be controlled appropriately.

It should be noted however, that if the silicon substrate is etched via the resist patterns as shown in FIG. 4, the region of the silicon substrate masked by the etching width adjusting resist pattern 116' is separated from the silicon substrate or the frame 20. Thus, upon completion of the etching to the silicon substrate or in a step thereafter, the separated portion which is leaving the silicon substrate can damage the oscillator. The term the step thereafter used here refers, for example, to a step of removing a SiO$_2$ film or a resist film in a method in which the SiO$_2$ film or the resist film is provided as an etching-stop layer on the back surface of the silicon substrate. Damage on the oscillator degrades the arm symmetry, which affects the performance of the angular velocity sensor. On the other hand, if the silicon substrate is etched via the resist patterns as shown in FIG. 5, a region of the silicon substrate masked by the etching width adjusting resist pattern 116' is fixed to the silicon substrate or the frame 20. Thus, upon completion of the etching to the silicon substrate and in the step thereafter, the portion of the silicon substrate masked by the etching width adjusting resist pattern 116' does not damage the oscillator.

Figure 2C:
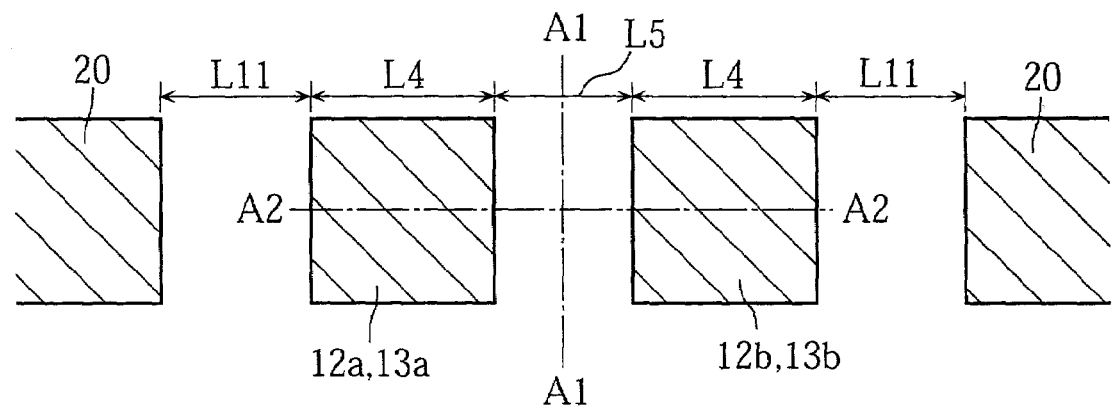

Alternatively, the width adjusting resist pattern 116' may not be used if an arrangement shown for example in FIG. 2C is employed. Specifically, the spacing distance L11 from the frame 20 to the first arms 12a, 12b and the second arms 13a, 13b is 200 µm, the arm-to-arm distance L5 between the first arms 12a, 12b, and between the second arms 13a, 13b is 200 µm, and tip-to-frame distance L11' from the frame 20 to the tips of the first arms 12a, 12b and the second arms 13a, 13b is 200 µm. According to such an arrangement, the etching rate to the material substrate between the arms and between the frame and the arms can be equalized without using the etching width adjusting resist pattern 116'.

As shown in FIG. 1, the driving piezoelectric element 40 is provided at a Y 11' formed by the first arms 12a, 12b and the support 11, i.e., at a place which includes the first arm 12a, the support 11 and the first arm 12b. The driving piezoelectric element 40 has a layered structure, in which a piezoelectric film 42 is sandwiched between a lower electrode 41 and an upper electrode 43. The lower electrode 41 is connected to a pattern wiring 71 which runs on one of the torsion bars 30 to a driving lower electrode pad 81. The upper electrode 43 is connected to a pattern wiring 73 which runs on the other of the torsion bars 30 to a driving lower electrode pad 83. The piezoelectric film 42 is made of ZnO, AlN, PZT and so on. The electrodes 41, 43 are made of Al, Cu, Au and so on.

The detecting piezoelectric elements 50, 60 are provided, as shown in FIG. 1, respectively at the junction between the second arm 13a and the support 11, and at the junction between the second arm 13b and the support 11. In the H-shaped oscillator 10, the junction between the support 11 and the arms is the portion that deflects most, and therefore, the detecting piezoelectric elements 50, 60 according to the present embodiment are able to detect oscillation of the H-shaped oscillator 10 highly sensitively. The detecting piezoelectric element 50 has a layered structure, in which a piezoelectric film 55 is sandwiched between a lower electrode 54 and an upper electrode 56. The lower electrode 54 is connected to a pattern wiring 74 which runs on one of the torsion bars 30 and leads to a detecting lower electrode pad 84. The upper electrode 56 is connected to a pattern wiring 76 which runs on the same torsion bar 30 and leads to a detecting lower electrode pad 86. The detecting piezoelectric element 60 has a layered structure, in which a piezoelectric film 68 is sandwiched between a lower electrode 67 and an upper electrode 69. The lower electrode 67 is connected to a pattern wiring 77 which runs on one of the torsion bars 30 and leads to a detecting lower electrode pad 87. The upper electrode 69 is connected to a pattern wiring 79 which runs on the same torsion bar 30 and leads to a detecting upper electrode pad 89. The piezoelectric films 55, 68 may be made of ZnO, AlN or PZT. The electrodes 54, 56, 67, 69 may be made of Al, Cu or Au.

In the angular velocity sensor 101, when AC voltage is applied to the driving piezoelectric element 40, the reverse piezoelectric effect causes the piezoelectric film 42 to expand and shrink alternately. This causes bending oscillations or in-plane vibrations V1, V2 of the pair of first arms 12a, 12b in mutually reversed phases, along the X-axis. The bending oscillations or in-plane vibrations V1, V2 in mutually reversed phases are also caused in the pair of second arms 13a, 13b, along the X-axis. An optimum voltage frequency to be applied for the drive is a frequency generally equal to the in-plane vibration mode of the first arm 12a, 12b, which is dependent upon the size of the H-shaped oscillator 10 and so on. According to the embodiment, an AC voltage of 80 kHz may be used, which enables efficient driving of the H-shaped oscillator 10, and to provide a highly sensitive angular velocity sensor 101. When the H-shaped oscillator 10 is under a constant oscillation and rotated about the Z-axis at an angular velocity of ω, it comes under the Coriolis force F (F=−2mVω, where m represents the mass of oscillator, and V represents the speed of oscillation) acting along the Y-axis, i.e., perpendicular to the paper as in FIG. 1. This causes the H-shaped oscillator 10 to oscillate in a different mode of oscillation, namely to oscillate in a direction parallel to the Y-axis ("out-of-plane oscillation"). The H-shaped oscillator 10 under such an oscillation has distortion in a, plane perpendicular to the Y-axis, and this distortion is detected on the basis of piezoelectric effect acting on the piezoelectric films 55, 68 of the detecting piezoelectric elements 50, 60. The piezoelectric elements 50, 60 give an output proportional to the Coriolis force F or the angular velocity ω.

Figure 6:
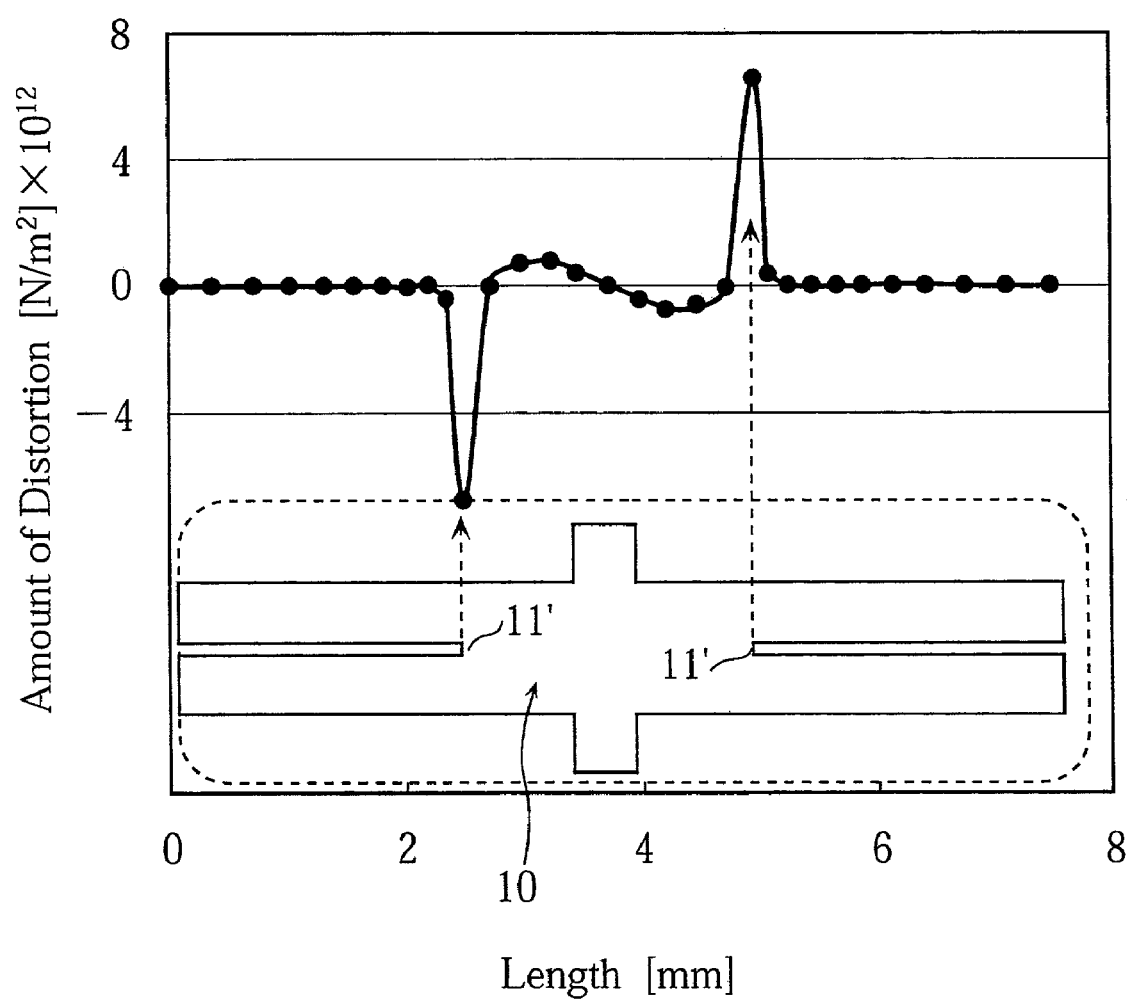
FIG. 6 is a graph showing distortion of an H-shaped oscillator in a driving mode.

As shown in FIG. 6, when the H-shaped oscillator 10 performs in-plane vibration, the greatest distortion appears at the Y 11' provided by the support 11 and the first arms 12a, 12b, and at the Y 11' provided by the support 11 and the second arms 13a, 13b. Thus, as shown in FIG. 1, the driving piezoelectric element 40 is disposed at the Y 11' of the H-shaped oscillator 10, thereby enabling efficient driving of the H-shaped oscillator 10.

Figure 7:
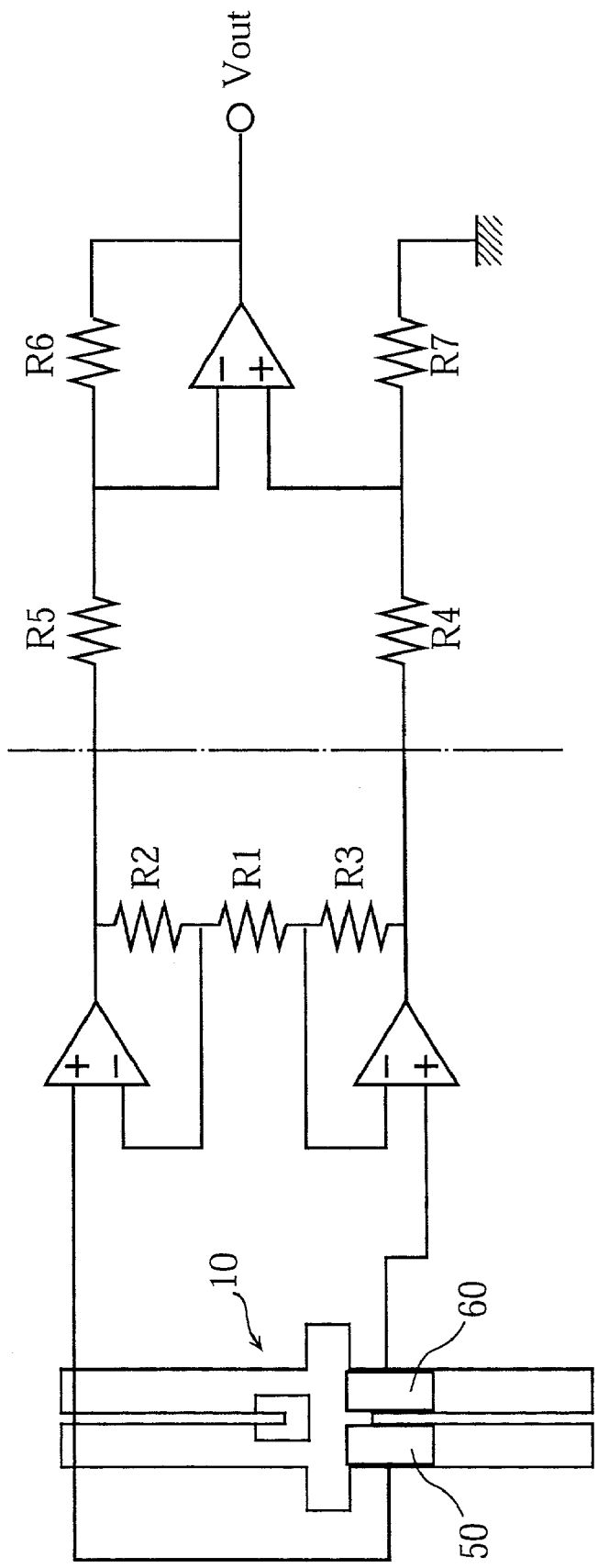
FIG. 7 shows a detecting circuit applicable to the angular velocity sensor of the present invention.

Detection signal from the detecting piezoelectric element 50 disposed on the second arm 13a, and detection signal from the detecting piezoelectric element 60 disposed on the second arm 13b can be picked by a detecting circuit prepared, for example, as a differential circuit as shown in FIG. 7. The differential circuit in FIG. 7 can improve detecting sensitivity and decrease external noise. Note that the differential circuit in FIG. 7 is divided into right and left regions by a dashed line. Gain in the left region is expressed has 1+(R2+R3)/R1, whereas gain in the right region is expressed as R5/R6 (where R5=R4, and R6=R7).

Figure 8A:
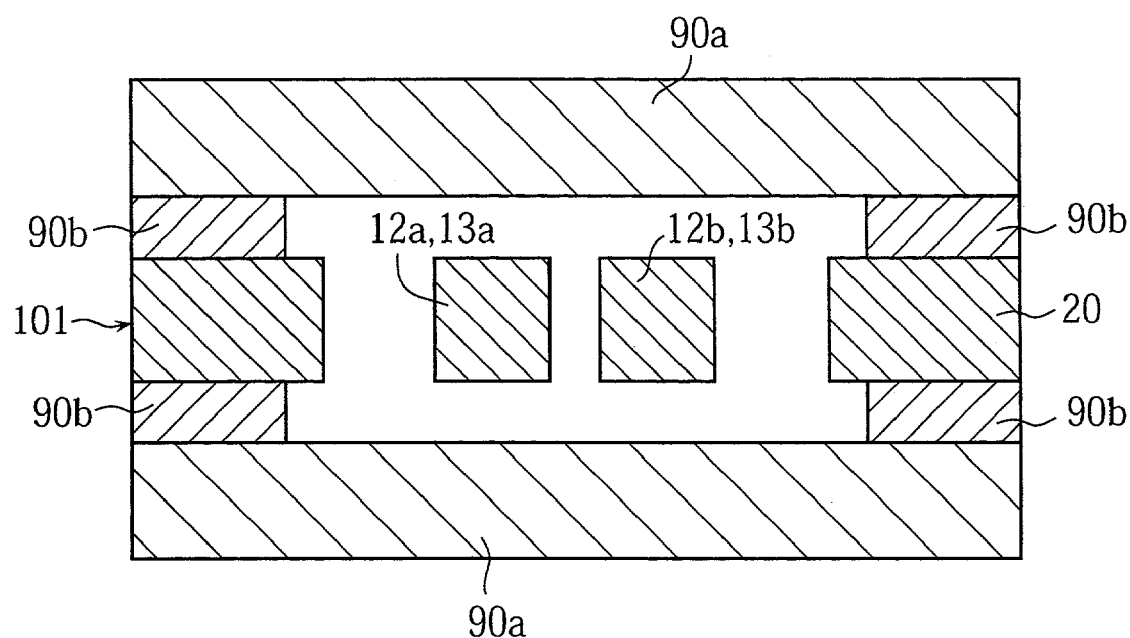
FIGS. 8A and 8B are sectional views taken in lines II—II in FIG. 1, when the angular velocity sensor in FIG. 1 is packaged.
Figure 8B:
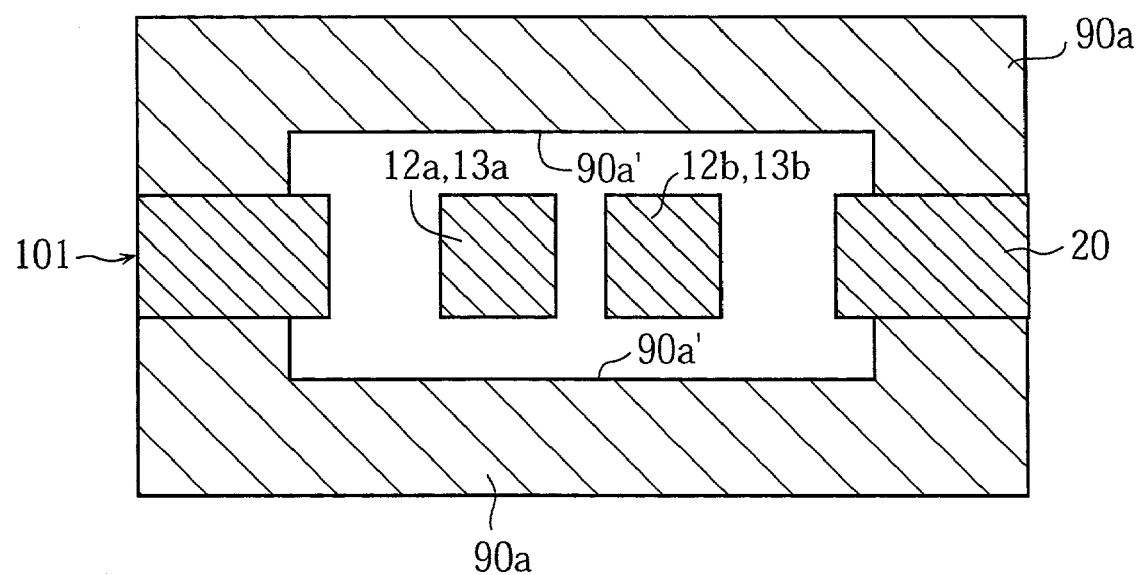

FIG. 8 is a view taken along lines II—II in FIG. 1, showing a section of the angular velocity sensor 101 in FIG. 1 under a packaged state. In the angular velocity sensor 101, the H-shaped oscillator 10 and the frame 20 are integrated via the torsion bars 30. Thus, the packaging of the angular velocity sensor 101 can be performed easily, as shown in FIG. 8A, by e.g. anodic joining and direct joining that bonds packaging members 90a made of glass or Si to the frame 20 via spacers 90b. Alternatively, as shown in FIG. 8B, each of the packaging members 90a made of glass or Si may be formed with a recess 90a' by RIE or sandblasting, before the packaging members 90a are bonded to the angular velocity sensor 101 by the anode bonding, the direct bonding and so on.

Figure 9A:
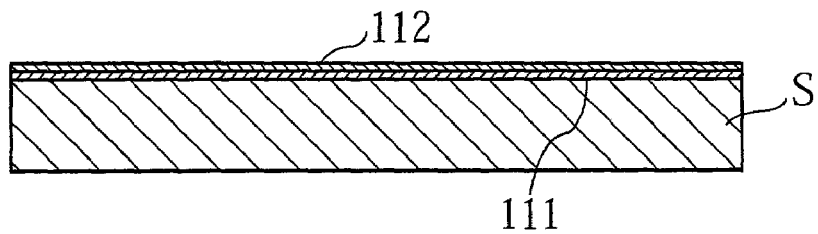
FIGS. 9A~9F show part of steps in a method of making the angular velocity sensor in FIG. 1.

FIGS. 9A~9F show part of steps in an example of the method of making the angular velocity sensor 101 in FIG. 1. FIGS. 10A~10D show steps following those in FIGS. 9A~9F. FIGS. 9A~9F and 10A~10D show changes in a section taken along lines IX—IX in FIG. 1 as the manufacturing steps proceed. When making the angular velocity sensor 101, first, as shown in FIG. 9A, a silicone substrate S is subjected to thermal oxidization for forming an oxide film 111 of SiO$_2$. Further, a metal film 112 (from which the lower electrodes 41, 54, 67 are eventually made by pattern formation) is formed by spattering, vapor deposition, etc., using such a metal as Al. The oxide film 111 is made to a thickness of about 0.2 μm, whereas the metal film 112 is formed to a thickness of about 0.1 μm. The oxide film 111 is formed if the silicon substrate is the low-resistance substrate whose specific resistance is smaller than about 1000 Ωcm, in order to prevent the finished angular velocity sensor 101 from holding unwanted capacitance. Therefore, the oxide film 111 may not be formed if the silicone substrate S is the high-resistance substrate which has a specific resistance not smaller than about 1000 Ωcm.

Figure 9B:
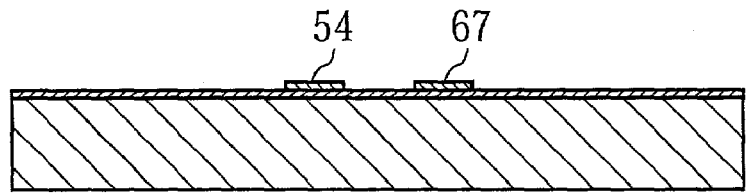

Next, as shown in FIG. 9B, the metal film 112 is etched via a predetermined etching mask. The etching may be dry etching or wet etching. In the wet etching, etching solution to be used may be selected from those containing such a main ingredient as phosphoric acid, acetic acid and nitric acid. Through this etching, pattern formation is achieved for lower electrodes 41, 54, 67 at a region to be the H-shaped oscillator 10, for lower electrode pads 81, 84, 87 at a region to be the frame 20, and for wiring patterns 71, 74, 77 which connect these patterns.

Figure 9C:
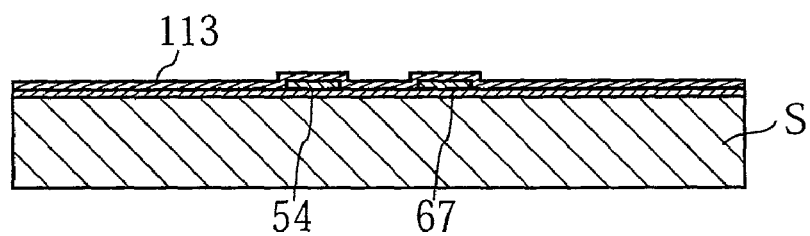
Figure 9D:
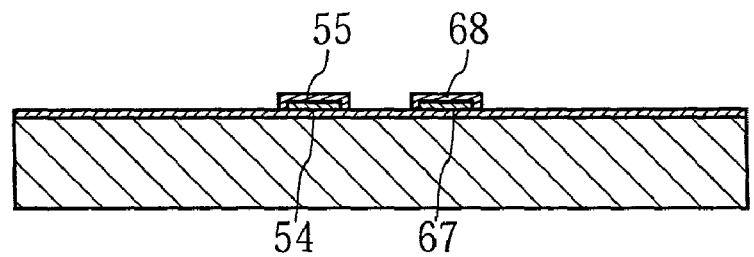

Next, as shown in FIG. 9C, the silicon substrate S is subjected to e.g. a spattering, vapor depositing and printing process of a piezoelectric material such as ZnO, AlN, PZT and so on, to form a piezoelectric thin film 113. The piezoelectric thin film 113 is formed to a thickness necessary for vibrating the H-shaped oscillator 10 at a desired frequency, or to a thickness of e.g. 1 μm. Then, as shown in FIG. 9D, the piezoelectric film 113 is etched via a predetermined etching mask. When wet etching is employed for this step, etching solutions which can be used for this step include water solution of acetic acid. This etching leaves piezoelectric films 42, 55, 68 formed respectively on the lower electrodes 41, 54, 67.

Figure 9E:
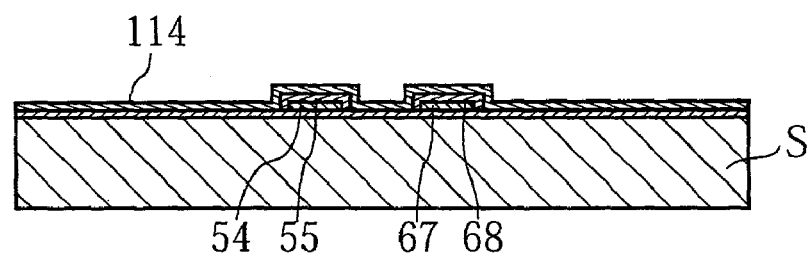
Figure 9F:
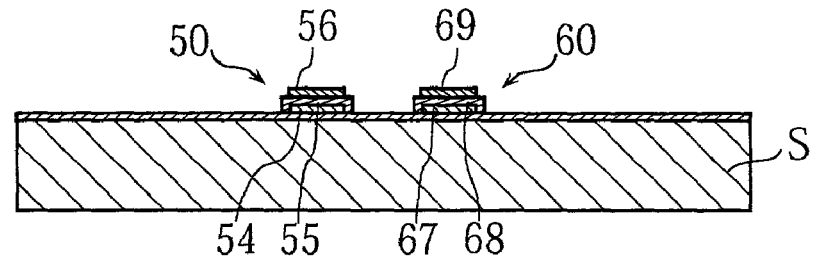

Next, as shown in FIG. 9E, the silicon substrate S is subjected to e.g. a spattering and vapor depositing process to form a metal film 114 of e.g. Al. The metal film 114 is formed to a thickness of about 1 μm. Then, as shown in FIG. 9F, the metal film 114 is etched via a predetermined etching mask. The etching may be dry etching or wet etching. In the dry etching, etching gas to be used may contain $BCl_3$, $Cl_2$ and so on. This etching leaves upper electrodes 43, 56, 69 formed respectively on the piezoelectric films 42, 55, 68, upper electrode pads 83, 86, 89 formed on a region to be the frame 20, and wiring patterns 73, 76, 79 which connect these.

Figure 10A:
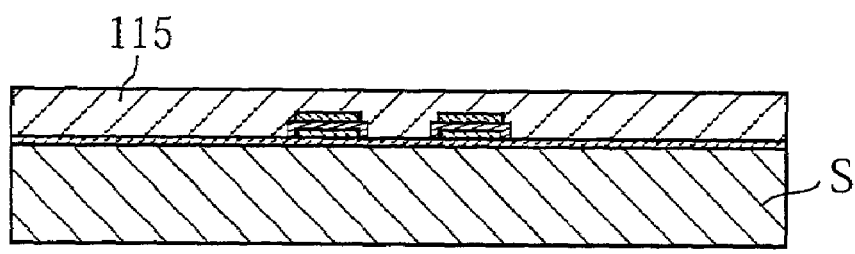
FIGS. 10A~10D show steps following those in FIGS. 9A~9F.
Figure 10B:
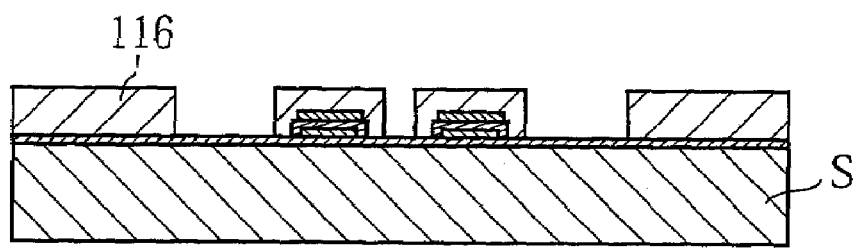
Figure 10C:
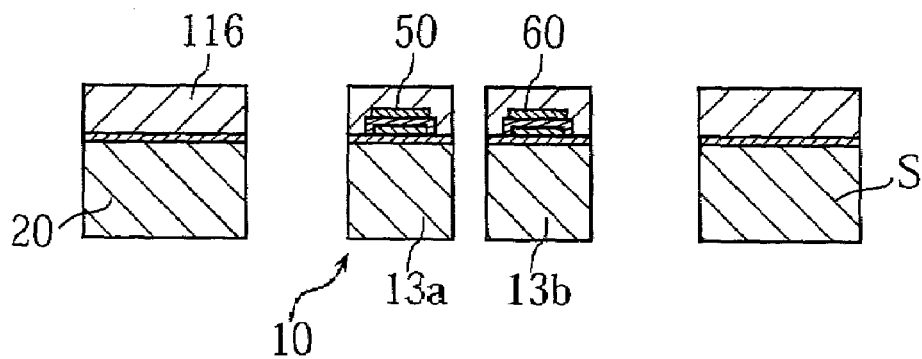
Figure 10D:
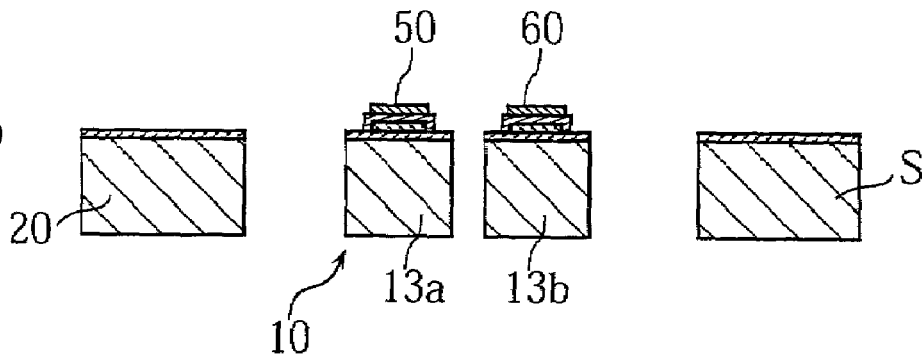

Thus, the silicon substrate S is formed with the driving piezoelectric element 40, the detecting piezoelectric elements 50, 60 and relevant wiring patterns. Then, as shown in FIG. 10A, a photo resist 115 is formed on the silicon substrate S. Next, as shown in FIG. 10B, the photo resist 115 undergoes a patterning process (including light-exposing and developing) to form a resist pattern 116. The resist pattern 116 has a plan-view shape of the angular velocity sensor 101 which includes the H-shaped oscillator 10, the frame 20 and the torsion bars 30, and covers the driving piezoelectric element 40 and the detecting piezoelectric elements 50, 60. Next, as shown in FIG. 10C, deep-RIE is performed via the resist pattern 116, until the silicon substrate S is penetrated. This step leaves the H-shaped oscillator 10, the frame 20 and the torsion bars 30 formed integrally with each other. Thereafter, as shown in FIG. 10D, the resist pattern 116 is removed, to complete the angular velocity sensor 101 in which the H-shaped oscillator 10, the frame 20 and the torsion bars 30 are integrally formed, and the driving piezoelectric element 40 and the detecting piezoelectric elements 50, 60 are provided on the H-shaped oscillator 10. It should be noted however, that according to the present invention, as has been described earlier with reference to FIG. 4 and FIG. 5, the step in FIG. 10B may include formation of the etching width adjusting resist pattern 116', in addition to the formation of the resist pattern 116. The formation of both contributes to the equalization of deep-RIE etching rates at various places etched in the step shown in FIG. 10C.

Figure 11A:
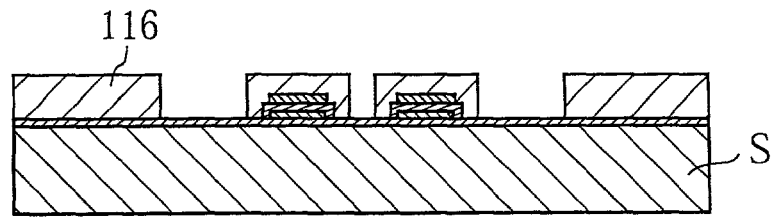
FIGS. 11A~11F show another sequence of steps following those in FIGS. 9A~9F.
Figure 11B:
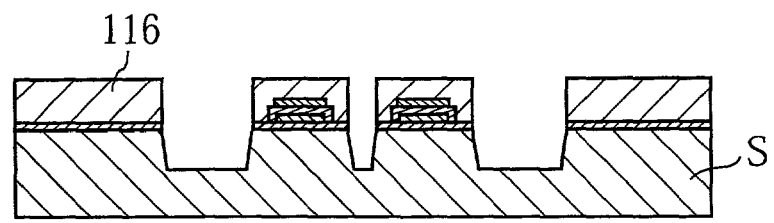
Figure 11C:
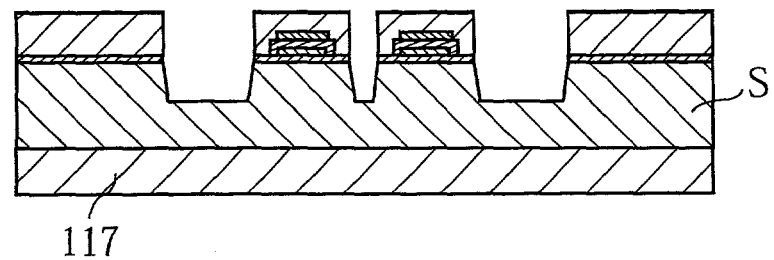
Figure 11D:
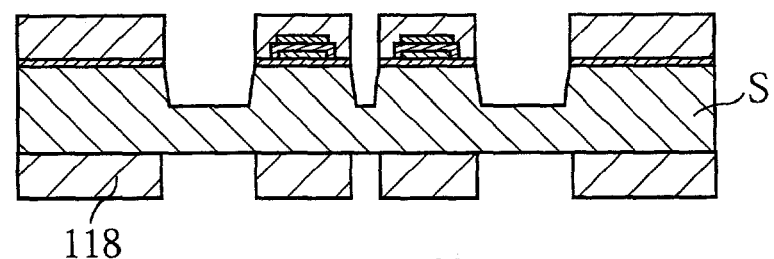
Figure 11E:
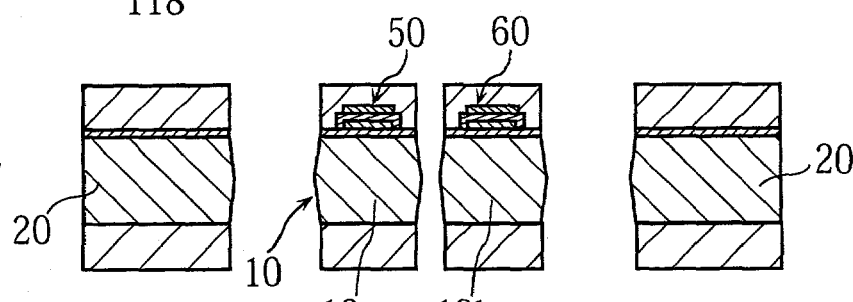
Figure 11F:
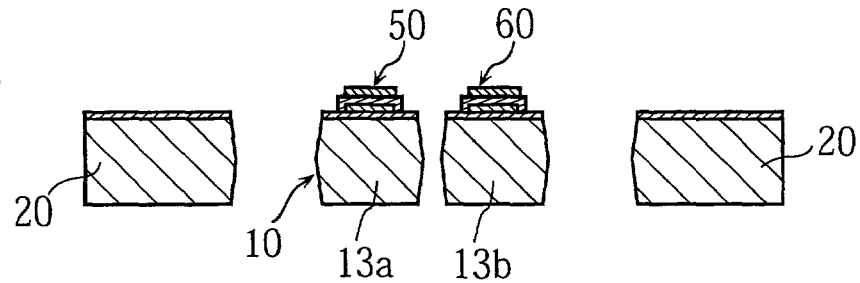

The steps shown in FIGS. 10A~10D are those that follow the series of steps shown in FIGS. 9A~9F, in the process of single-surface etching for the integral formation of the H-shaped oscillator 10, the frame 20 and the torsion bars 30. Alternatively, a two-surface etching to be described below may be used. In the two-surface etching, the steps already described and illustrated in the FIG. 10A and 10B follow the sequence shown in FIG. 9, to come to the sate shown in FIG. 11A. More specifically, the photo resist 115 is formed on the silicon substrate S, which undergoes the patterning process, to form the resist pattern 116. Next, as shown in FIG. 11B, crystalline anisotropic etching, which is a wet etching, is performed via the resist pattern 116 to an intermediate position in the silicon substrates. This step forms an upper half of the H-shaped oscillator 10, the frame 20 and the torsions bars 30 on the substrate. Next, as shown in FIG. 11C, a photo resist 117 is formed on the silicon substrate S, which undergoes, as shown in FIG. 11D, the patterning process, to form a resist pattern 118. Next, as shown in FIG. 11E, the crystalline anisotropic etching is performed via the resist pattern 118 to the intermediate position in the silicon substrate S until the substrate is penetrated. This step completes the integral formation of the H-shaped oscillator 10, the frame 20 and the torsions bars 30. Then, as shown in FIG. 11F, the resist patterns 116, 118 are removed, to complete the angular velocity sensor 101 in which the H-shaped oscillator 10, the frame 20 and the torsion bars 30 are integrally formed, and the driving piezoelectric element 40 and the detecting piezoelectric elements 50, 60 are provided on the H-shaped oscillator 10. It should be noted however, that according to the present invention, as described earlier with reference to FIG. 4 and FIG. 5, the steps in FIG. 11A and FIG. 11D may include formation of the etching width adjusting resist pattern 116', in addition to the formation of the resist pattern 116, 118. The formation of both patterns serves to equalize etching rates at the places etched in the steps shown in FIG. 11B and FIG. 11E by the crystalline anisotropic etching.

Figure 12:
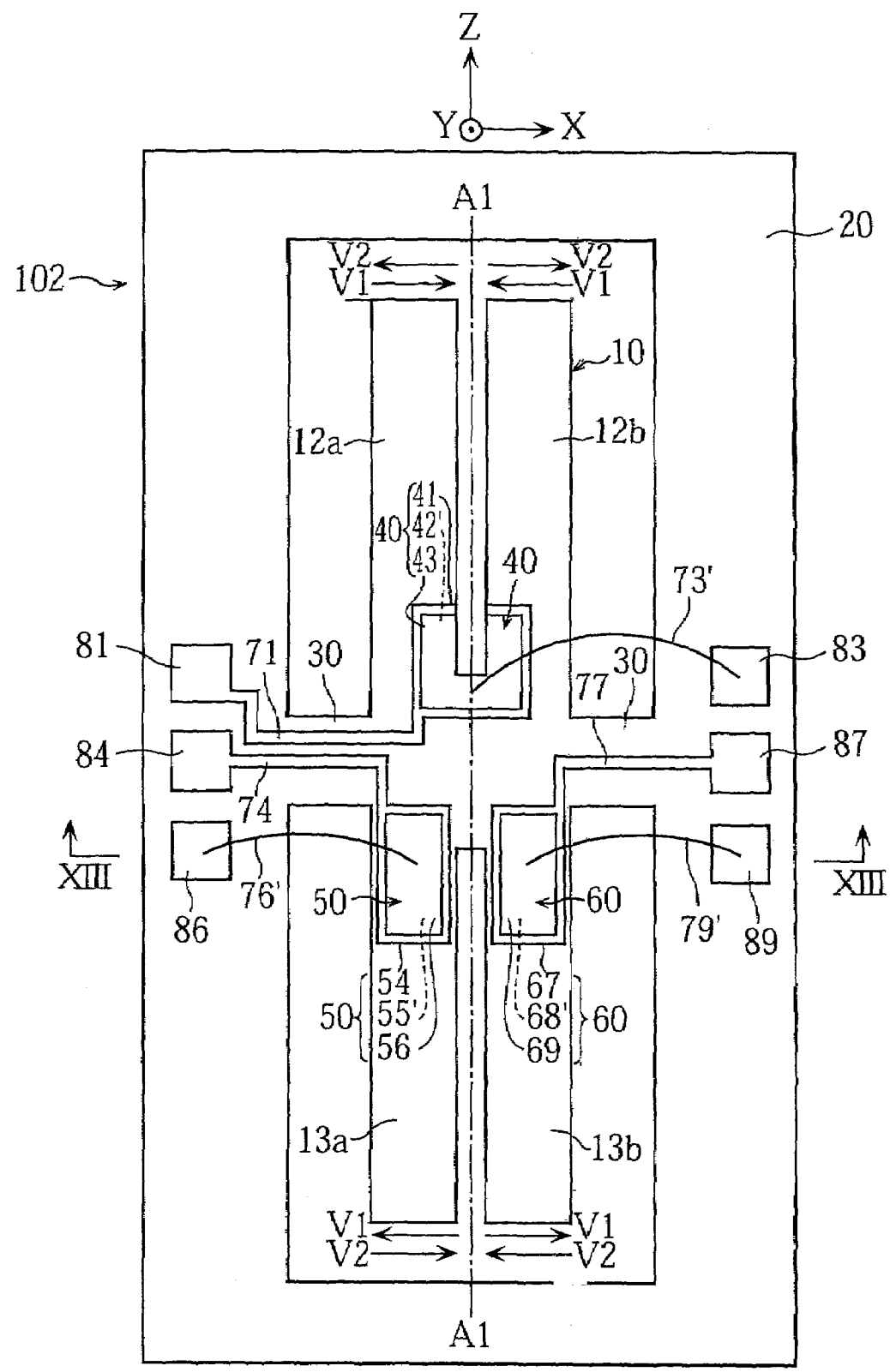
FIG. 12 is a plan view showing an angular velocity sensor according to a second embodiment of the present invention.
Figure 13:
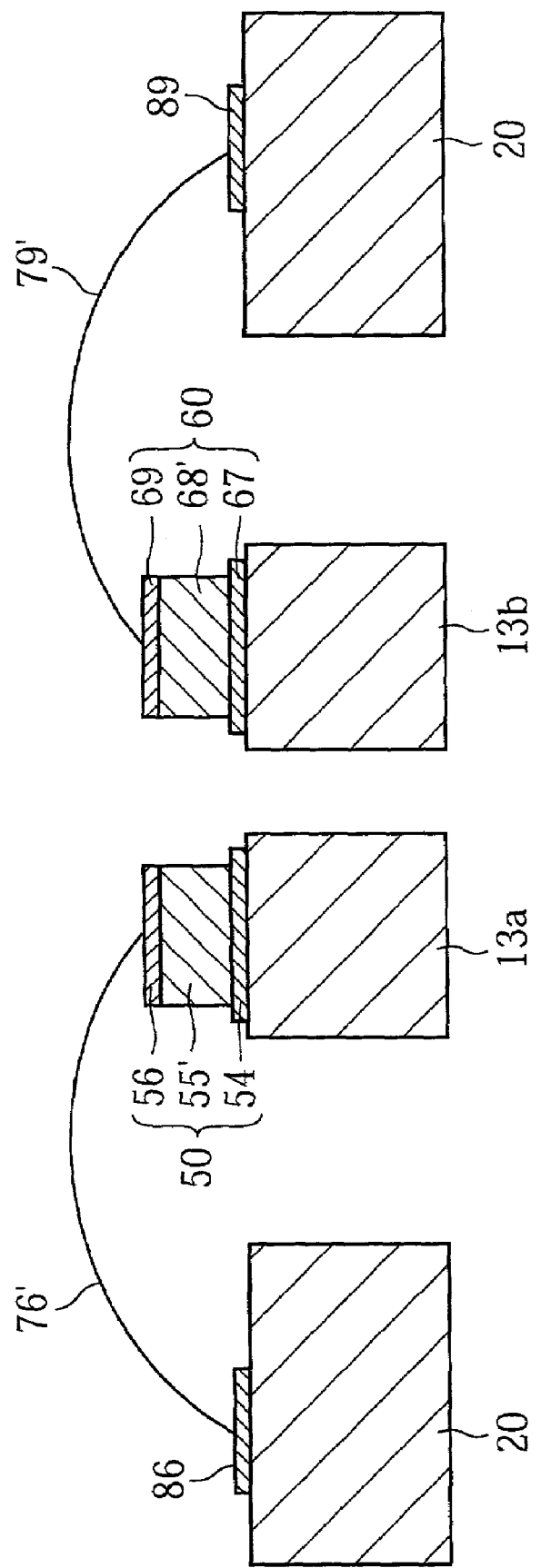
FIG. 13 is a sectional view taken in lines XIII—XIII in FIG. 12.

FIG. 12 is a plan view showing an angular velocity sensor 102 according to a second embodiment of the present invention. FIG. 13 is a sectional view taken in lines XIII—XIII in FIG. 12. The angular velocity sensor 102 is different from the angular velocity sensor 101 in the forms of the driving piezoelectric element 40, the detecting piezoelectric elements 50, 60 and apart of the pattern wirings. Specifically, the driving piezoelectric element 40 has a layered structure, in which a bulky piezoelectric member 42' is sandwiched between a lower electrode 41 and an upper electrode 43. The piezoelectric member 42' has a thickness of about 100 μm. The lower electrode 41 is connected to a pattern wiring 71 which runs on one of the torsion bars 30 to a driving lower electrode pad 81. The upper electrode 43 is connected to a driving lower electrode pad 83 via a wire 73'. The wire 73' is made of Au for example. The piezoelectric member 42' is made of ZnO, AlN, PZT and so on. According to the present invention, an additional metal film made of Al, Cu, Au and so on may be inserted between the piezoelectric member 42' and the lower electrode 41 of the driving piezoelectric element 40, as a part of the lower electrode of the piezoelectric element.

The detecting piezoelectric element 50 has a layered structure, in which a bulky piezoelectric member 55' is sandwiched between a lower electrode 54 and an upper electrode 56. The lower electrode 54 is connected to a pattern wiring 74 which runs on one of the torsion bars 30 and leads to a detecting lower electrode pad 84. The upper electrode 56 is connected to a detecting lower electrode pad 86 via a wire 76'. The detecting piezoelectric element 60 has a layered structure, in which a bulky piezoelectric member 68' is sandwiched between a lower electrode 67 and an upper electrode 69. The lower electrode 67 is connected to a pattern wiring 77 which runs on one of the torsion bars 30 and leads to a detecting lower electrode pad 87. The upper electrode 69 is connected to a detecting upper electrode pad 89 via a wire 79'. The piezoelectric members 55', 68' are made of ZnO, AlN, PZT and so on, having a thickness of about 100 μm. The electrodes 54, 56, 67, 69 are made of Al, Cu, Au and so on. According to the present invention, an additional metal film made of Al, Cu or Au may be inserted between the piezoelectric member 55' and the lower electrode 54 of the detecting piezoelectric element 50, as a part of the lower electrode of the piezoelectric element. Similarly, an additional metal film made of Al, Cu, Au and so on may be inserted between the piezoelectric member 68' and the lower electrode 67 of the detecting piezoelectric element 60, as a part of the lower electrode of the piezoelectric element. Further, according to the present invention, the angular velocity sensor 102 may be composed without the upper electrode pads 83, 86, 89 on the frame 20. In such a structure, the one ends of the wire 73', 76', 79', the other ends of which respectively connect to the upper electrode 43, 56, 69, are directly connected to the driving or the detecting circuit for the angular velocity sensor 102.

In the angular velocity sensor 102 having the above-described construction, when a predetermined AC voltage is applied to the driving piezoelectric element 40, the reverse piezoelectric effect causes the piezoelectric member 42' to begin an expanding and shrinking movement. This causes in-plane vibrations V1, V2 of the pair of first arms 12a, 12b and the pair of second arms 13a, 13b of the H-shaped oscillator 10, along the X-axis in FIG. 12. When the H-shaped oscillator 10 is rotated about the Z-axis at an angular velocity of ω under its constant in-plane oscillation, the H-shaped oscillator 10 is caused to oscillate in a different mode of oscillation, namely to oscillate also in a vertical plane or along the Y-axis. The H-shaped oscillator 10 under such an oscillation has distortion in a plane vertical to the Y-axis, and this distortion is detected on the basis of piezoelectric effect acting on the piezoelectric members 55', 68' of the detecting piezoelectric elements 50, 60. The piezoelectric elements 50, 60 give an output proportional to the angular velocity ω. Detection signal from the detecting piezoelectric elements 50, 60 can be picked by a detecting circuit as shown, for example, in FIG. 7.

The piezoelectric members 42', 55', 68' of the driving piezoelectric element 40 and detecting piezoelectric elements 50, 60 for the angular velocity sensor 102 is thicker than the piezoelectric films 42, 55, 68 for the angular velocity sensor 101. Such piezoelectric members 42', 55', 68' tend to have a larger piezoelectric constant. With the driving piezoelectric element 40 and the detecting piezoelectric elements 50, 60, the angular velocity sensor 102 exhibits higher performance than the sensor 101.

Figure 14A:
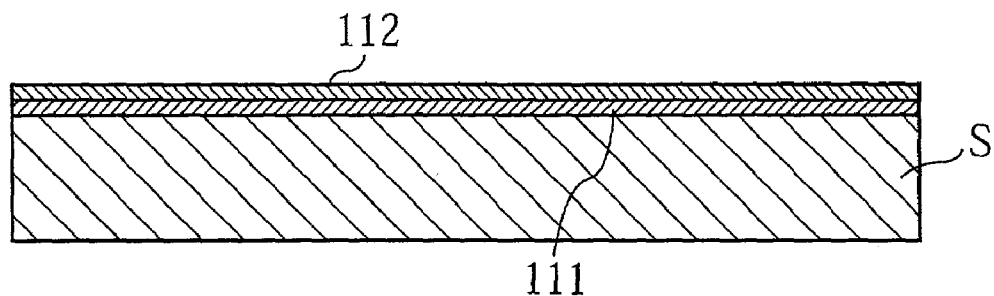
FIGS. 14A~14D show part of steps in a method of making the angular velocity sensor in FIG. 12.
Figure 14B:
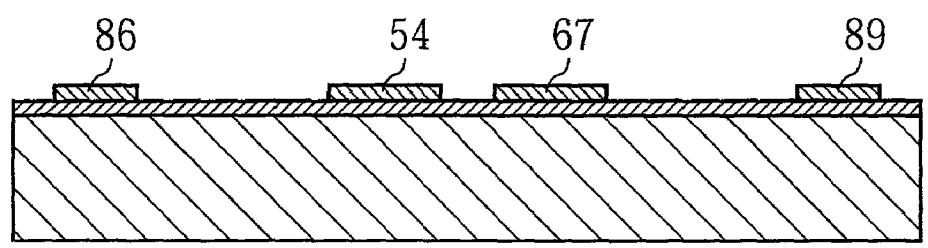

FIGS. 14A~14D and 15A~15D show an example of the method of making the angular velocity sensor 102 in FIG. 12. FIGS. 14A~14D and 15A~15D show changes in a section taken along lines XIII—XIII in FIG. 12 as the manufacturing steps proceed. First, as shown in FIG. 14A, a silicone substrate S is treated in e.g. a thermal oxidization process to form an oxide film 111 of $SiO_2$. Further, a metal film 112, from which the lower electrodes 41, 54, 67 and so on for the angular velocity sensor 102 are eventually made by pattern formation, is formed on the substrate S. However, the oxide film 111 may not be formed if the silicone substrate S is the high-resistance substrate which has a specific resistance not smaller than about 1000 Ωcm. Next, as shown in FIG. 14B, the metal film 112 is etched via a predetermined etching mask. Through this etching, pattern formation is achieved for lower electrodes 41, 54, 67 at a region to be the H-shaped oscillator 10, for lower electrode pads 81, 84, 87 at a region to be the frame 20, and for wiring patterns 71, 74, 77 which connect these patterns. In this etching, the upper electrode pads 83, 86, 89 are also formed at a region to be the frame 20. Regarding the oxide film 111 and the metal film 112, growing and etching methods as well as material are the same as those described for the first embodiment angular velocity sensor 101 with reference to FIGS. 9A and 9B.

Figure 14C:
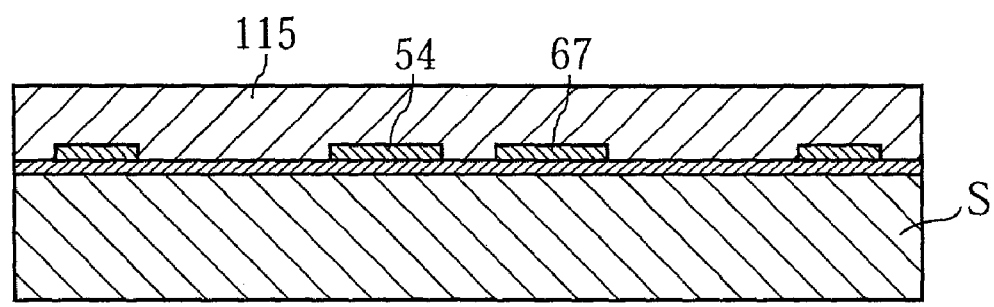
Figure 14D:
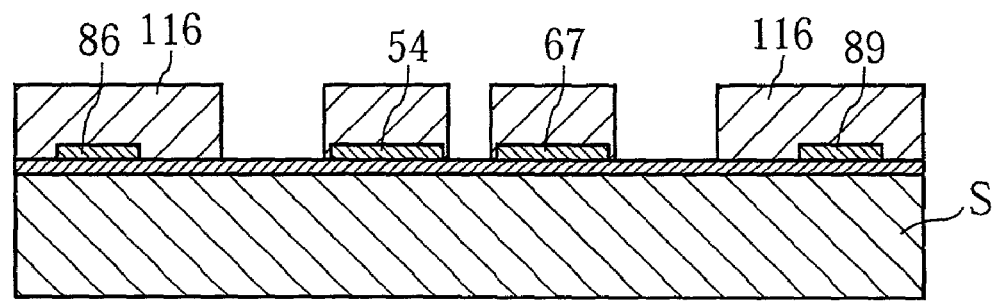

Then, as shown in FIG. 14C, a photo resist 115 is formed on the silicon substrate S. Next, as shown in FIG. 14D, the photo resist 115 undergoes a patterning process of exposing and developing, to form a resist pattern 116. The resist pattern 116 has a plan-view shape of the angular velocity sensor 102 which includes the H-shaped oscillator 10, the frame 20 and the torsion bars 30, and covers the lower electrodes 41, 54, 67, the lower electrode pads 81, 84, 87, wiring patterns 41, 54, 67 for connecting them and the upper electrode pads 83, 86, 89.

Figure 15A:
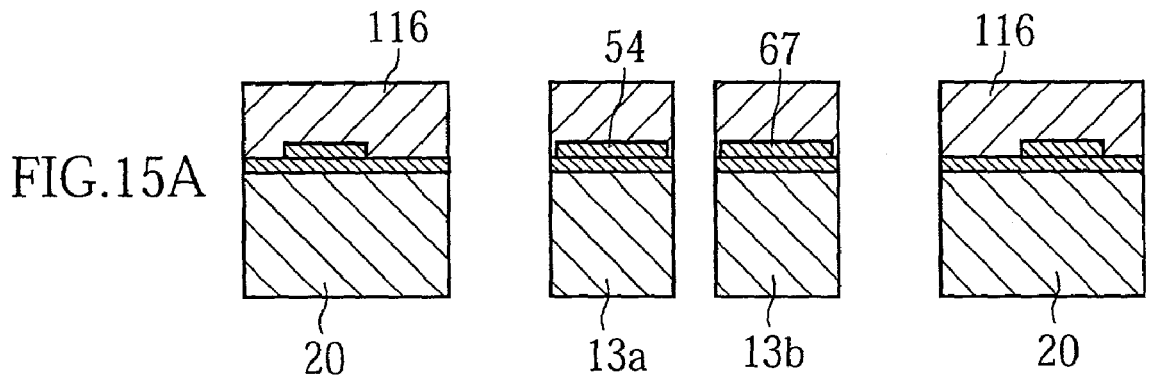
FIGS. 15A~15D show steps following those in FIGS. 14A~14D.
Figure 15B:
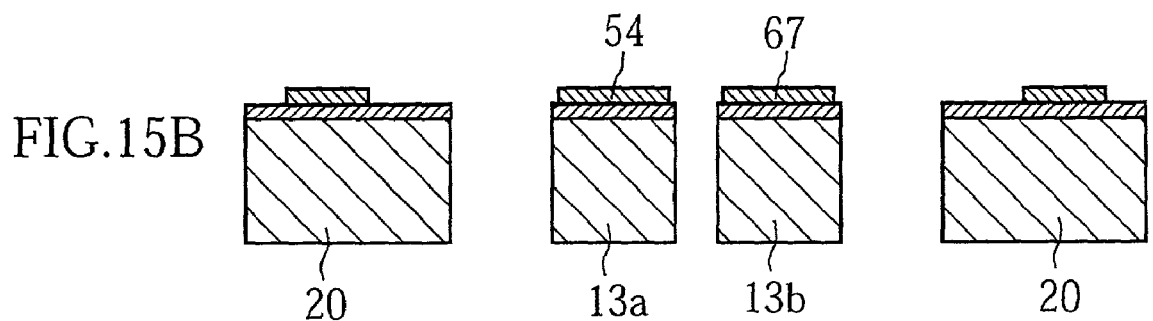

Next, as shown in FIG. 15A, deep-RIE is performed via the resist pattern 116, until the silicon substrate S is penetrated. This step leaves the H-shaped oscillator 10, the frame 20 and the torsion bars 30 formed integrally with each other. Thereafter, as shown in FIG. 15B, the resist pattern 116 is removed.

Figure 15C:
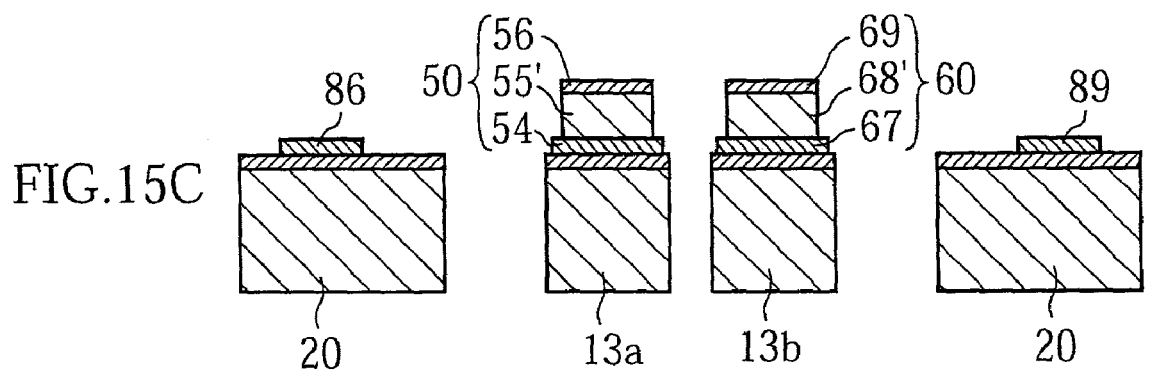

Next, as shown in FIG. 15C, the piezoelectric members 42' 55', 68' which are formed beforehand with upper electrodes 43, 56, 69 are formed on the lower electrodes 41, 54, 67. For example, the piezoelectric members 42' 55', 68' are fixed on the lower electrodes 41, 54, 67 via conductive adhesive. The piezoelectric members 42' 55', 68' formed beforehand with upper electrodes 43, 56, 69 are prepared in such a way that a bulky piezoelectric material is formed with a metal film on its selected surface and then processed to be shaped preferably. The piezoelectric members 42', 55', 68' are made of ZnO, AlN, PZT and so on, having a thickness of about 100 μm. The upper electrodes 43, 56, 69 are formed on the piezoelectric members 42', 55', 68' by e.g. vapor deposition and spattering of Al, Cu or Au. After formed with the lower electrodes 41, 54, 67, the piezoelectric members 42', 55', 68' are subjected to polarization treatment. This polarization treatment is performed by applying voltage between the upper electrodes 43, 56, 69 and the corresponding lower electrodes 41, 54, 67 formed on the H-shaped oscillator 10 beforehand.

When formed with the upper electrodes 43, 56, 69, the piezoelectric members 42', 55', 68' maybe formed respectively with metal film as a part of the lower electrode on the facing away surface from the upper electrodes 43, 56, 69. The piezoelectric members 42', 55', 68' are prepared in such a way that metal films are formed on two surfaces of a piezoelectric bulk and those films are processed into the prescribed shape. In this case, the piezoelectric members 42', 55', 68' can be subjected to polarization treatment before they are placed on the lower electrodes 41, 54 or 67. This polarization treatment is performed by applying voltage between the upper electrodes 43, 56, 69 and the corresponding metal films formed at the same time as the upper electrodes 43, 56, 69. After the polarization treatment, the piezoelectric members 42', 55', 68' are formed on the corresponding lower electrodes 41, 54, 67 via the metal film. For example, conductive adhesive may be used for fixing the piezoelectric members 42' 55', 68' to the lower electrodes 41, 54, 67 via the above-mentioned metal film.

Figure 15D:
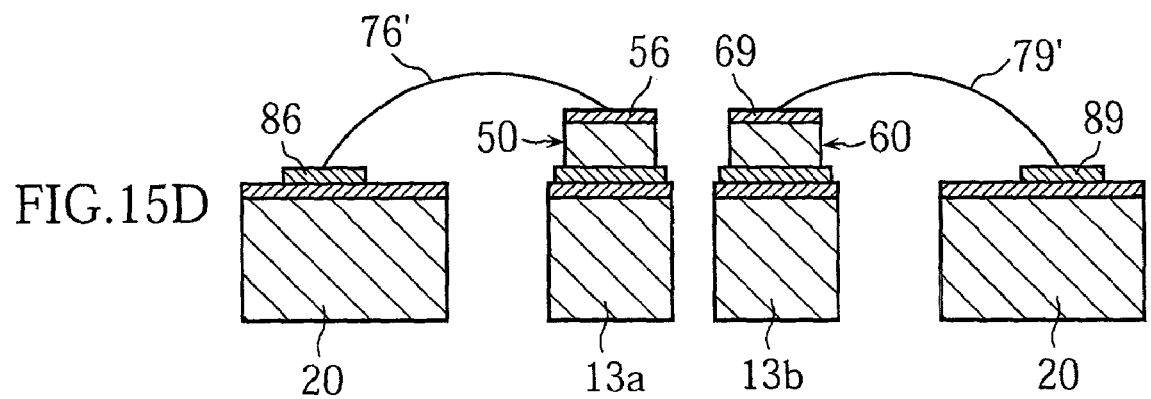

Next, as shown in FIG. 15D, the upper electrodes 43, 56, 69 are electrically connected to the corresponding upper electrode pads 83, 86, 89 by the wire 73', 76', 79' made of Au for example. Thus, the angular velocity sensor 102 is completed in which the H-shaped oscillator 10, the frame 20 and the torsion bars 30 are integrally formed, with the driving piezoelectric element 40 and the detecting piezoelectric elements 50, 60 provided on the H-shaped oscillator 10. It should be noted however, that according to the present invention, as described above with reference to FIG. 4 and FIG. 5, the step in FIG. 14D may include formation of the etching width adjusting resist pattern 116', in addition to the formation of the resist pattern 116. The formation of both can equalize the etching rates at various places etched in the step shown in FIG. 15A by the deep-RIE. In addition, as described above regarding the production of the angular velocity sensor 101 (first embodiment), the crystalline anisotropic two-surface etching may be used for integrally forming the H-shaped oscillator 10, the frame 20 and the torsion bars 30 in the step of FIG. 14D of the production of the second embodiment angular velocity sensor 102.

Figure 16:
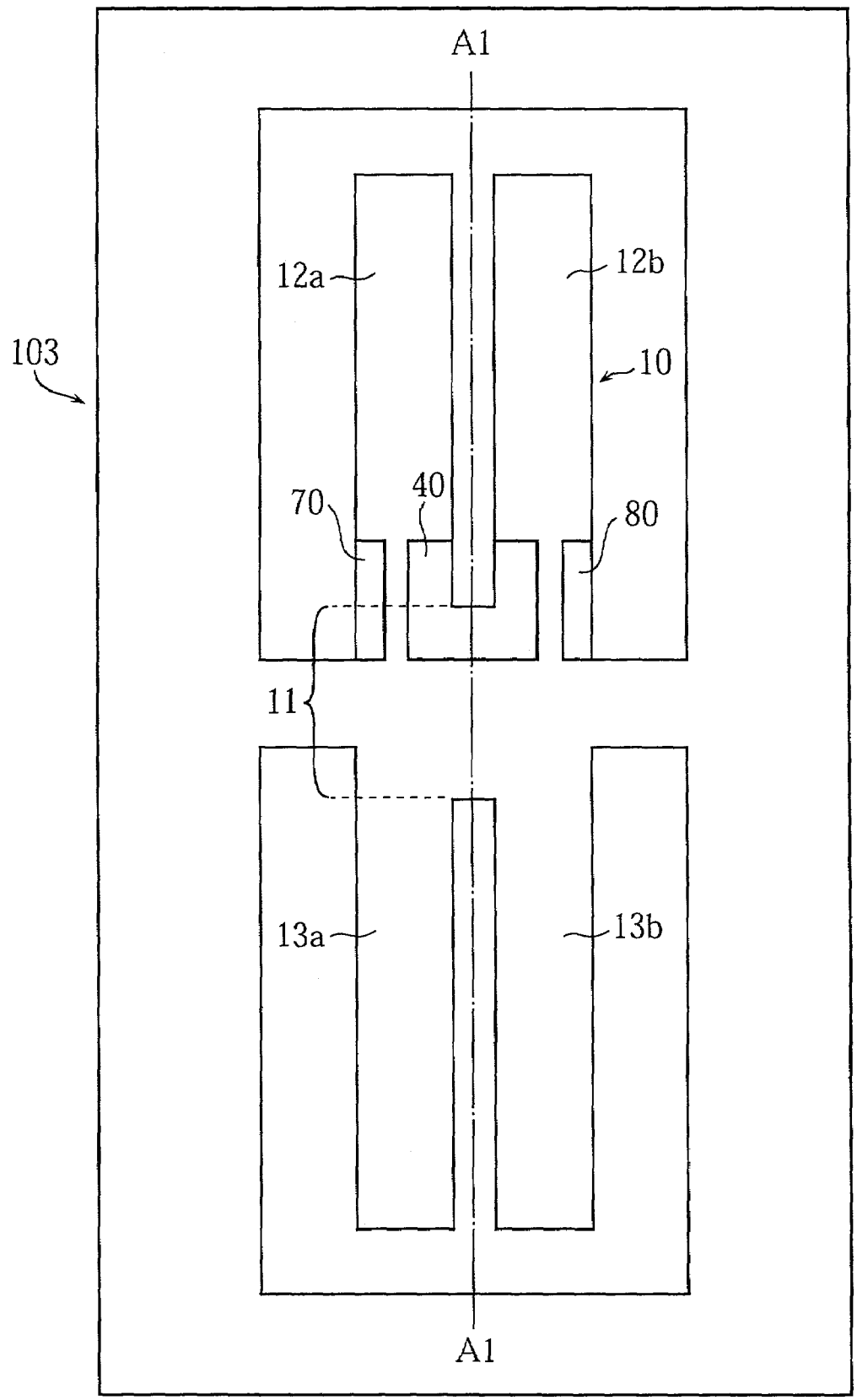
FIG. 16 is a plan view showing an angular velocity sensor according to a third embodiment of the present invention.

FIG. 16 is a plan view showing an angular velocity sensor 103 according to a third embodiment of the present invention. The angular velocity sensor 103 has its detecting piezoelectric elements disposed in a different manner from the angular velocity sensor 101. Specifically, a detecting piezoelectric element 70 is disposed at the junction between the support 11 and the first arm 12a, whereas a detecting piezoelectric element 80 is disposed at the junction between the support 11 and the first arm 12b. The detecting piezoelectric elements 70, 80 are disposed in symmetry with respect to the plane A1—A1 which is the plane of symmetry for the H-shaped oscillator 10. This contributes to maintaining the oscillation balance of the H-shaped oscillator 10. Thus, there is no increase of the drift, and the reliability of the angular velocity sensor 103 can be maintained for a long time. In the other respects, the third embodiment is identical with the angular velocity sensor 101, and therefore no further description will be given for the wiring patterns. As described above, the portion subjected to the greatest distortion in the H-shaped oscillator 10 is the junction between the support 11 and the arms. Therefore, the disposing pattern of the detecting piezoelectric elements achieves generally the same capability of detecting angular velocity as achieved by the angular velocity sensor 101.

Figure 17:
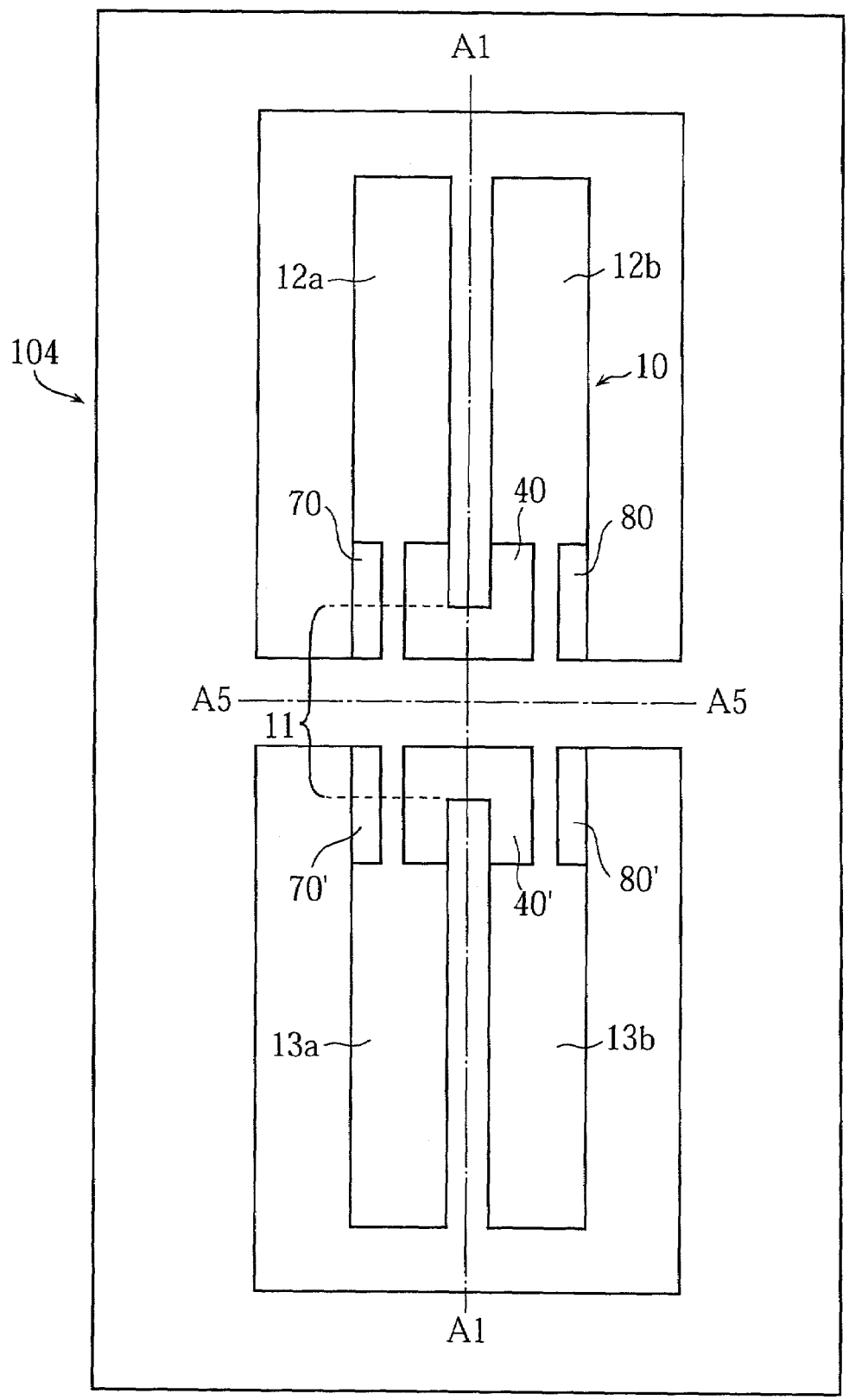
FIG. 17 is a plan view showing an angular velocity sensor according to a fourth embodiment of the present invention.

FIG. 17 is a plan view showing an angular velocity sensor 104 according to a fourth embodiment of the present invention. The angular velocity sensor 104 has its driving piezoelectric element and detecting piezoelectric elements disposed in a different manner from the angular velocity sensor 101. Specifically, a pair of detecting piezoelectric elements 70, 80 are disposed, respectively at junctions made by the support 11 with respective first arms 12a, 12b. Further, at a junction where the support 11 meets the second arms 13a, 13b, a driving piezoelectric elements 40' is provided to cover the second arm 13a, the support 11 and the second arm 13b, together with detecting piezoelectric elements 70', 80'. The detecting piezoelectric element 70 and the detecting piezoelectric element 80 are symmetrical with respect to the plane A1—A1 which is the plane of symmetry for the H-shaped oscillator 10, and so are the detecting piezoelectric element 70' and the detecting piezoelectric element 80'. At the same time, the driving piezoelectric element 40 and the driving piezoelectric element 40' are symmetrical with respect to a plane A5—A5 which is vertical to the plane of symmetry A1—A1, and the same symmetrical relationship exists between the detecting piezoelectric element 70' and the detecting piezoelectric element 70, and between the detecting piezoelectric element 80' and the detecting piezoelectric element 80. This maintains oscillation balance of the H-shaped oscillator 10. In the other aspects, the fourth embodiment is identical with the angular velocity sensor 101, and therefore no further description will be given for the wiring patterns. Further, as described earlier, the portion subjected to the greatest distortion in the H-shaped oscillator 10 is the junction between the support 11 and the arms. Therefore, the disposing pattern of the detecting piezoelectric elements according to the present embodiment also achieves generally the same capability of detecting angular velocity as achieved by the angular velocity sensor 101.

Figure 18:
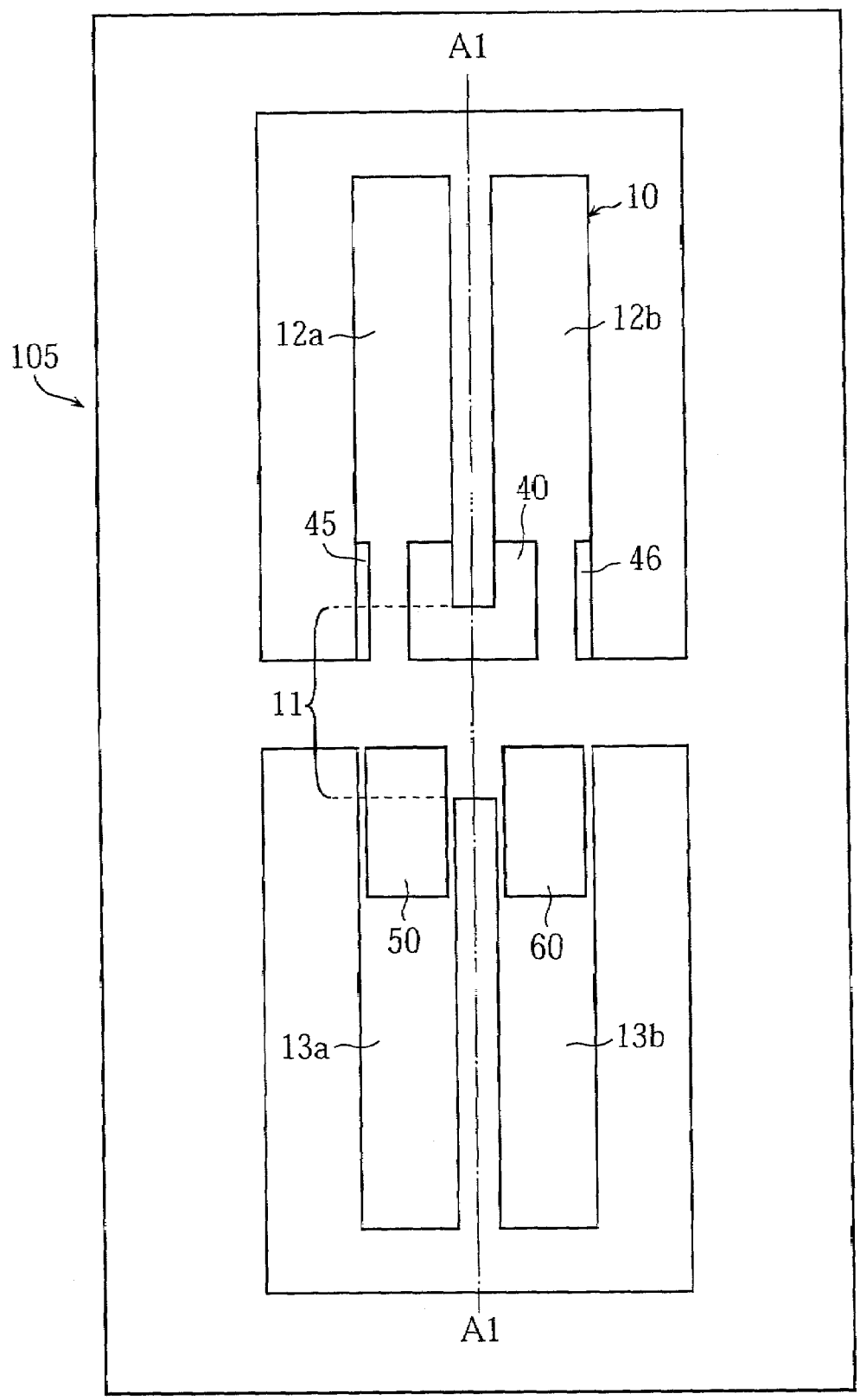
FIG. 18 is a plan view showing an angular velocity sensor according to a fifth embodiment of the present invention.
Figure 19:
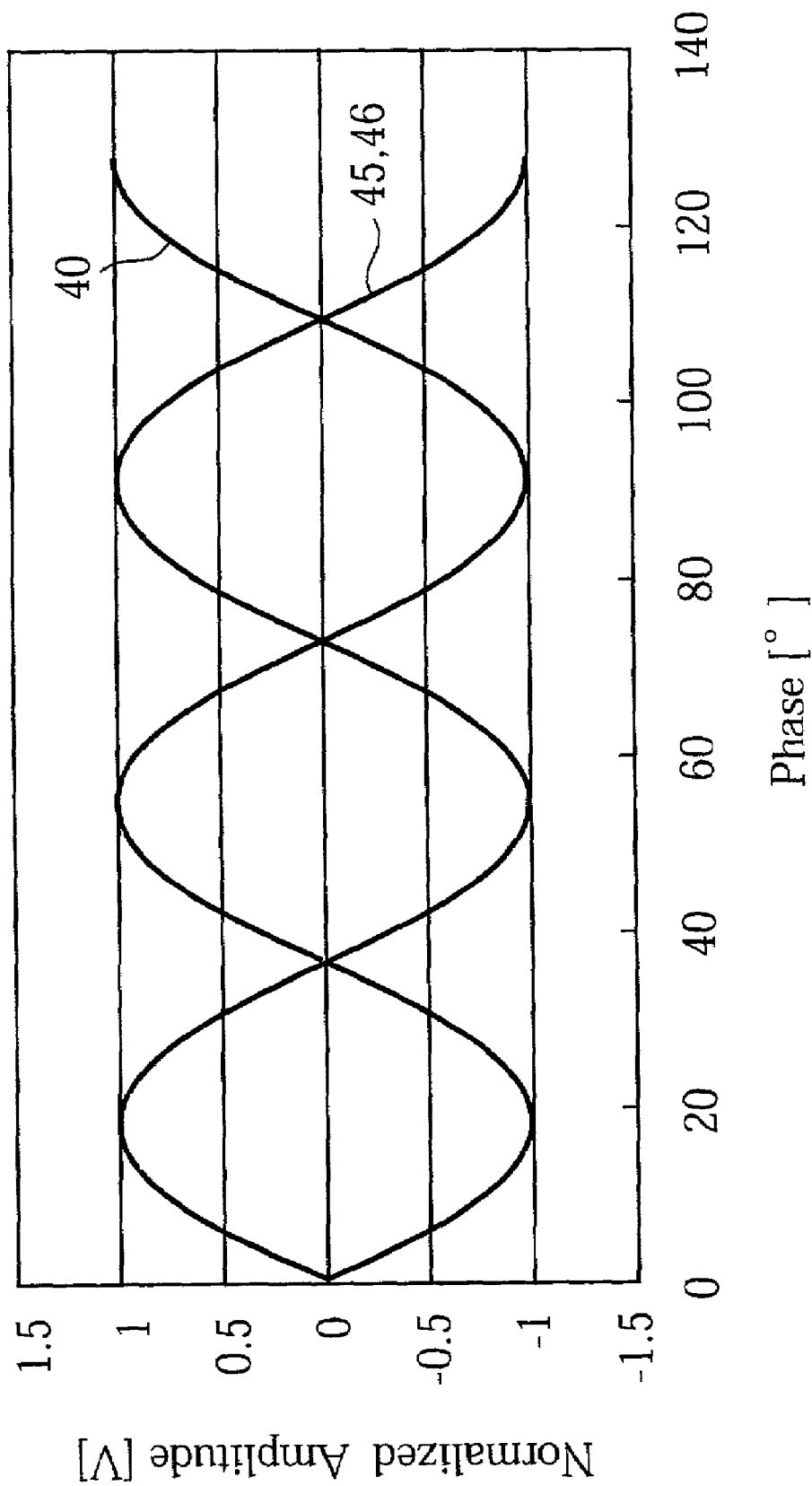
FIG. 19 is a graph showing voltages to be applied to the angular velocity sensor in FIG. 18.

FIG. 18 is a plan view showing an angular velocity sensor 105 according to a fifth embodiment of the present invention. The angular velocity sensor 105 has its driving piezoelectric elements disposed in a different manner from the angular velocity sensor 101. Specifically, in addition to the driving piezoelectric elements 40, driving piezoelectric elements 45, 46 are disposed respectively at junctions of the support 11 with respective first arms 12a, 12b. The driving piezoelectric elements 40, 45, 46 are disposed in symmetry with respect to the plane A1—A1 which is the plane of symmetry for the H-shaped oscillator 10, maintaining oscillation balance of the H-shaped oscillator 10. In the other respects, the sensor of the fifth embodiment is identical with the angular velocity sensor 101. When driving the angular velocity sensor 105 having such a construction, the driving piezoelectric element 40 and the other driving piezoelectric elements 45, 46 are supplied with different voltage signals. Specifically, as shown in FIG. 19, the others are given a voltage signal having the reversed phase. This makes each of the driving piezoelectric elements oscillate or elastically stretch in a reversed phase of the phase of the adjacent one, and increase the in-plane oscillation in each of the arms than in the angular velocity sensor 101 which is driven by only one driving piezoelectric element 40. As a result, sensitivity of the angular velocity sensor 105 is improved. In the other respects, the fifth embodiment is identical with the angular velocity sensor 101, and therefore no further description will be given for the wiring patterns.

Figure 20:
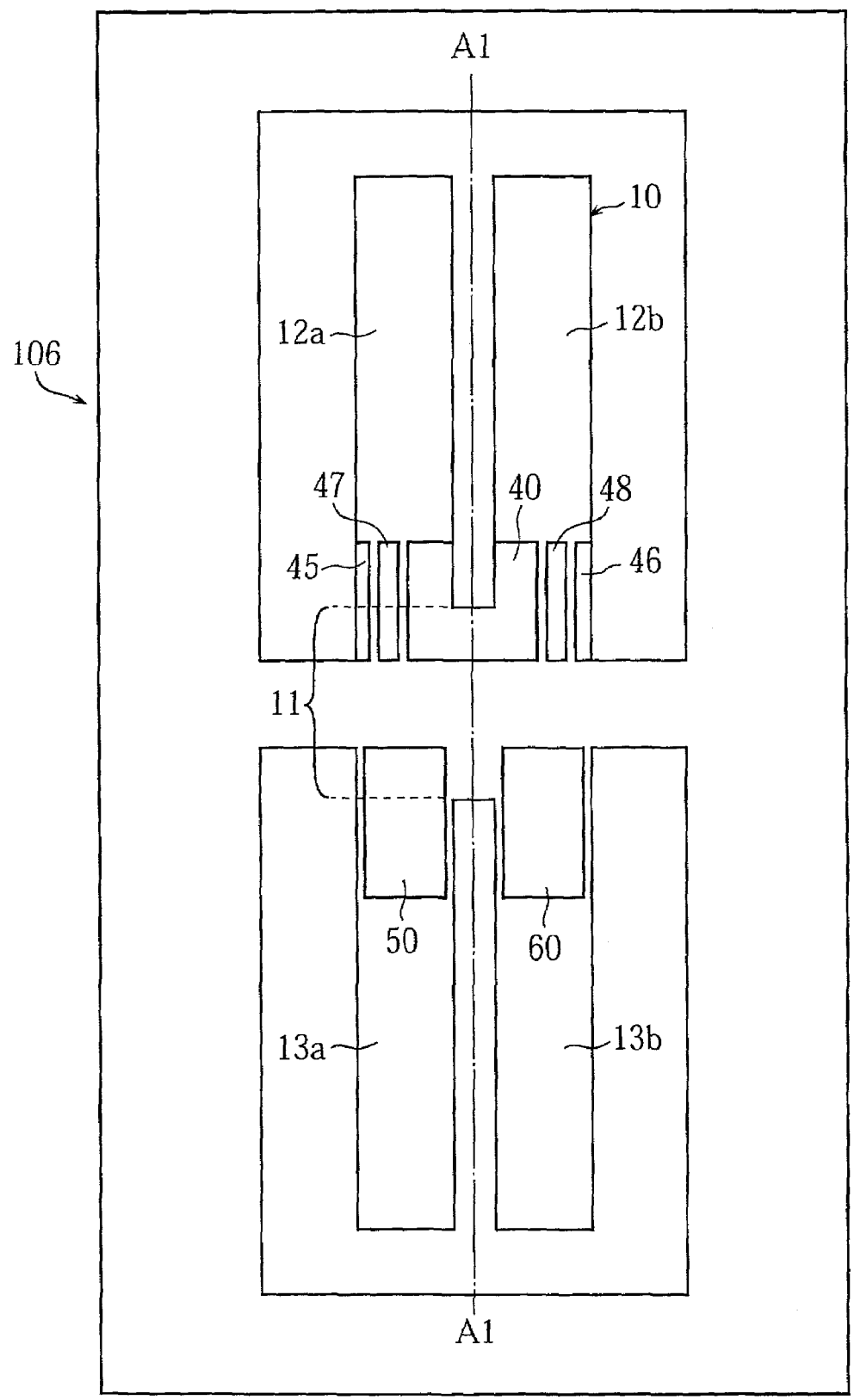
FIG. 20 is a plan view showing an angular velocity sensor according to a sixth embodiment of the present invention.
Figure 21:
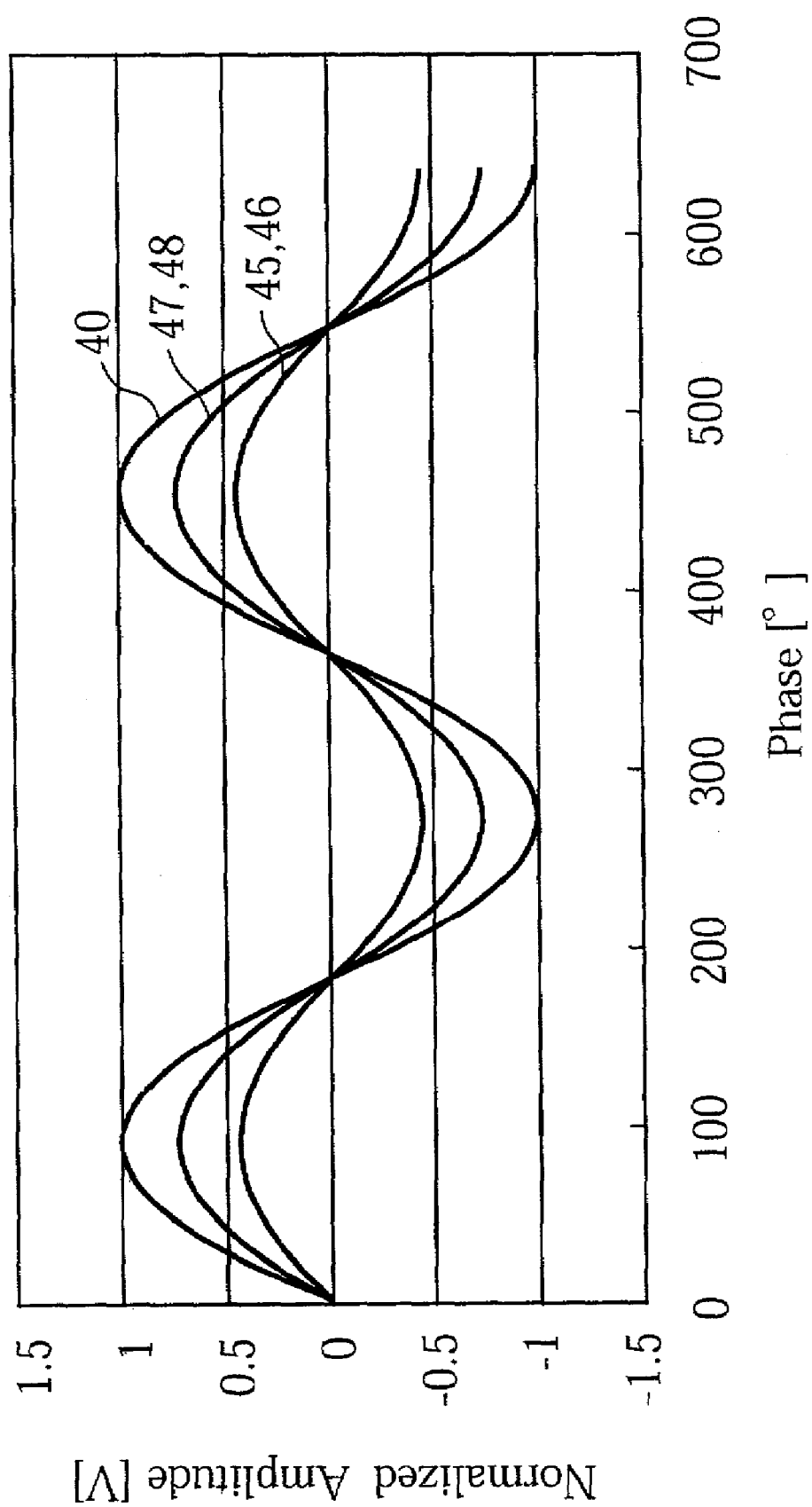
FIG. 21 is a graph showing voltages to be applied to the angular velocity sensor in FIG. 20.

FIG. 20 is a plan view showing an angular velocity sensor 106 according to a sixth embodiment of the present invention. The angular velocity sensor 106 has its driving piezoelectric elements disposed in a different manner from the angular velocity sensor 101. Specifically, in addition to the driving piezoelectric elements 40, driving piezoelectric elements 45, 46, 47, 48 are provided at the junction between the support 11 and the first arms 12a, 12b. The driving piezoelectric elements 40, 45, 46, 47, 48 are disposed in symmetry with respect to the plane of symmetry A1—A1 of the H-shaped oscillator 10, maintaining the balance of the H-shaped oscillator 10. In the other respects, the sensor of the sixth embodiment is identical with the angular velocity sensor 101. When driving the angular velocity sensor 106, the driving piezoelectric elements 40, 45, 46, 47, 48 are supplied with different voltage signals. Specifically, as shown in FIG. 21, one of three voltage signals differing in the amplitude is applied to each. This can change the amount of distortion in each of the piezoelectric elements in its oscillation or expanding and shrinking movement, and to increase the in-plane oscillation in each of the arms in comparison with the angular velocity sensor 101 which is driven by only one driving piezoelectric element 40. As a result, the sensitivity of the angular velocity sensor 106 is improved. Otherwise, the fifth embodiment is identical with the angular velocity sensor 101, and therefore no further description will be given for the wiring patterns.

Figure 22A:
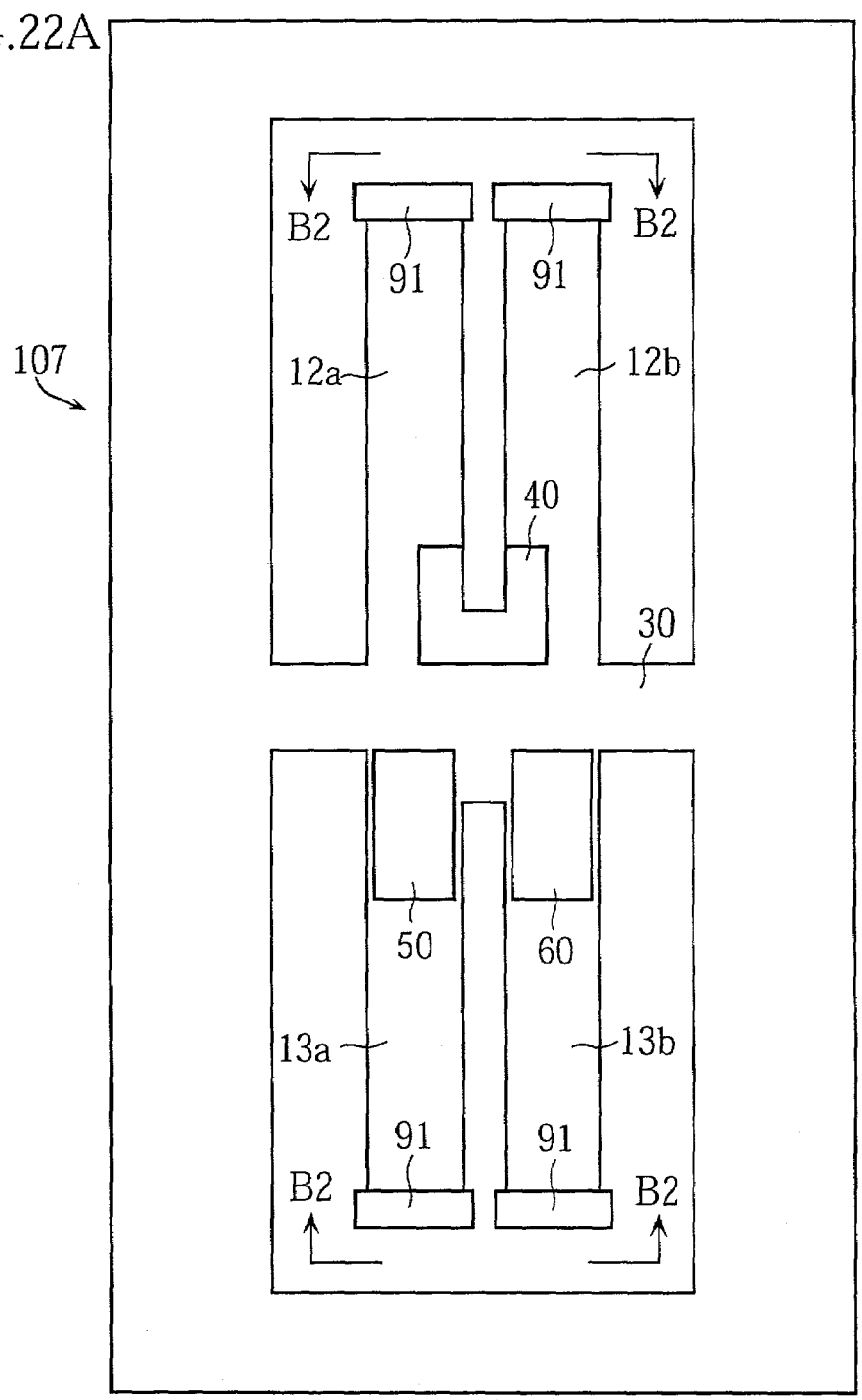
FIG. 22A is a plan view showing an angular velocity sensor according to a seventh embodiment of the present invention.
Figure 22B:
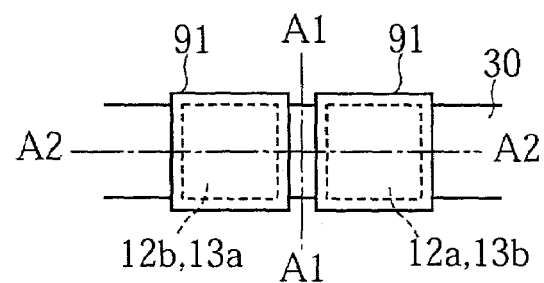
FIG. 22B is a sectional view taken in lines B2—B2 in FIG. 22A.

FIGS. 22A and 22B show an angular velocity sensor 107 according to a seventh embodiment of the present invention. FIG. 22A is a plan view of the angular velocity sensor 107, and FIG. 22B is a view taken along lines B2—B2 in FIG. 22A. The angular velocity sensor 107 is the angular velocity sensor 101 in which each of the first arms 12a, 12b and second arms 13a, 13b has its tip formed with a thick region 91. The thick regions 91 are symmetrical with respect to the plane A1—A1 which is the plane of symmetry for the H-shaped oscillator 10, and with respect to the plane of symmetry A2—A2, maintaining the balance of the H-shaped oscillator 10, and thereby preventing the H-shaped oscillator 10 from picking up a noise for example. In the other aspects, the seventh embodiment is identical with the angular velocity sensor 101, and therefore no further description will be given for the wiring patterns. By making the arm tips of the H-shaped oscillator 10 bigger than the arm bases as described above, it becomes possible to increase the Coriolis force generated, which then increases oscillation displacement of the arms in the detecting mode, leading to improved sensitivity of the angular velocity sensor 107.

Figure 23A:
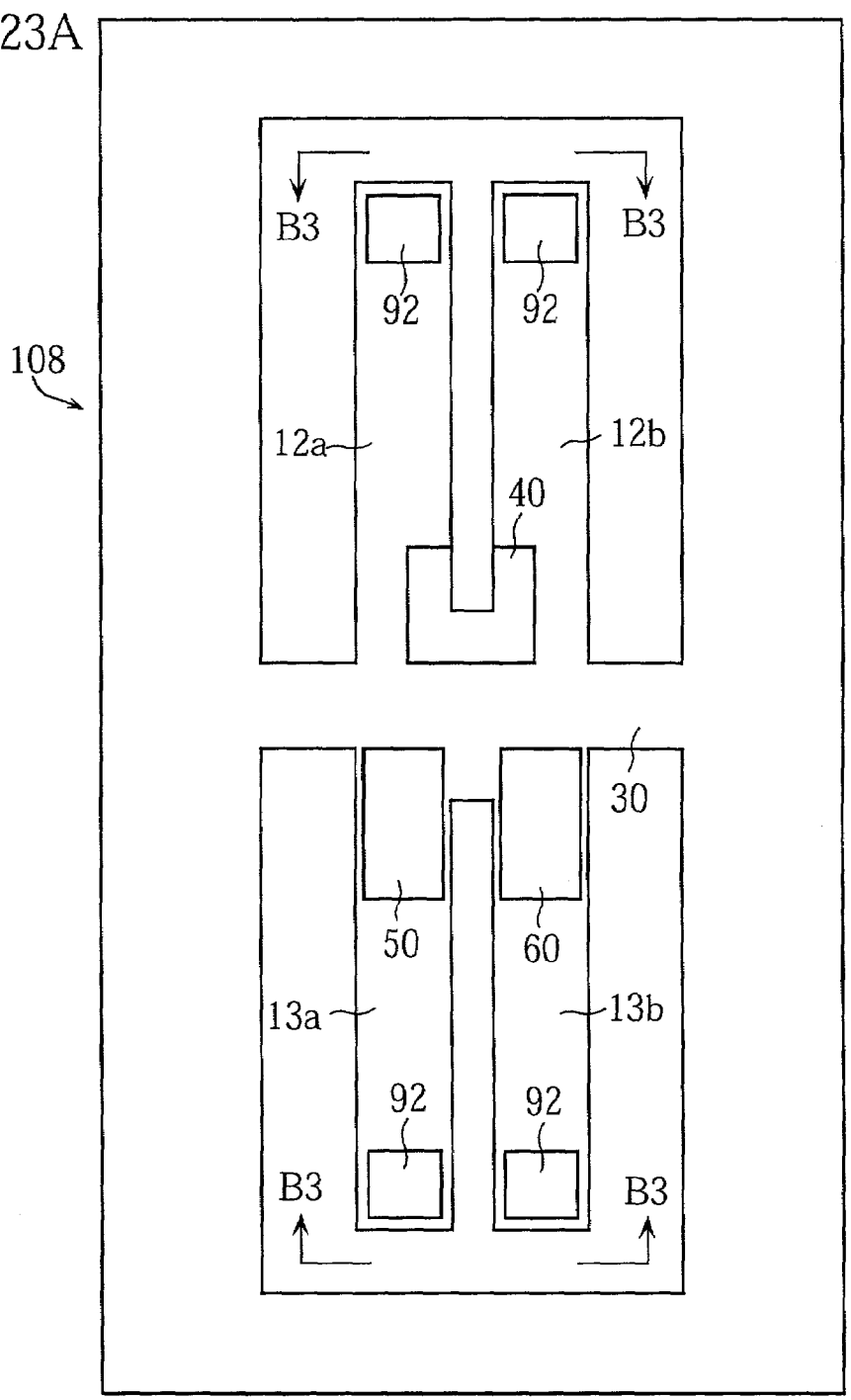
FIG. 23A is a plan view showing an angular velocity sensor according to an eighth embodiment of the present invention.
Figure 23B:
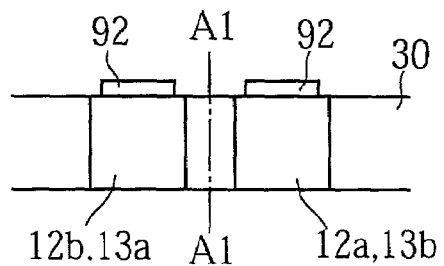
FIG. 23B is a sectional view taken in lines B3—B3 in FIG. 23A.

FIGS. 23A and 23B shows an angular velocity sensor 108 according to an eighth embodiment of the present invention. FIG. 23A is a plan view of the angular velocity sensor 108, and FIG. 23B is a view taken along lines B3—B3 in FIG. 23A. The angular velocity sensor 108 is the angular velocity sensor 101 having its first arms 12*a*, 12*b* and second arms 13*a*, 13*b* each provided with a weight 91 at its tip. The weights 92 are provided in symmetry with respect to the plane A1—A1 which is the plane of symmetry for the H-shaped oscillator 10, maintaining the balance of the H-shaped oscillator 10. In the other respects, the sensor of the eighth embodiment is identical with the angular velocity sensor 101, and therefore no further description will be given for the wiring patterns. Providing the arm tips of the H-shaped oscillator 10 with the weights 92 as described above generates a greater Coriolis force when the H-shaped oscillator 10 is oscillated. This increases oscillation displacement of the arms in the detecting mode, leading to improved performance of the angular velocity sensor 108.

Figure 24:
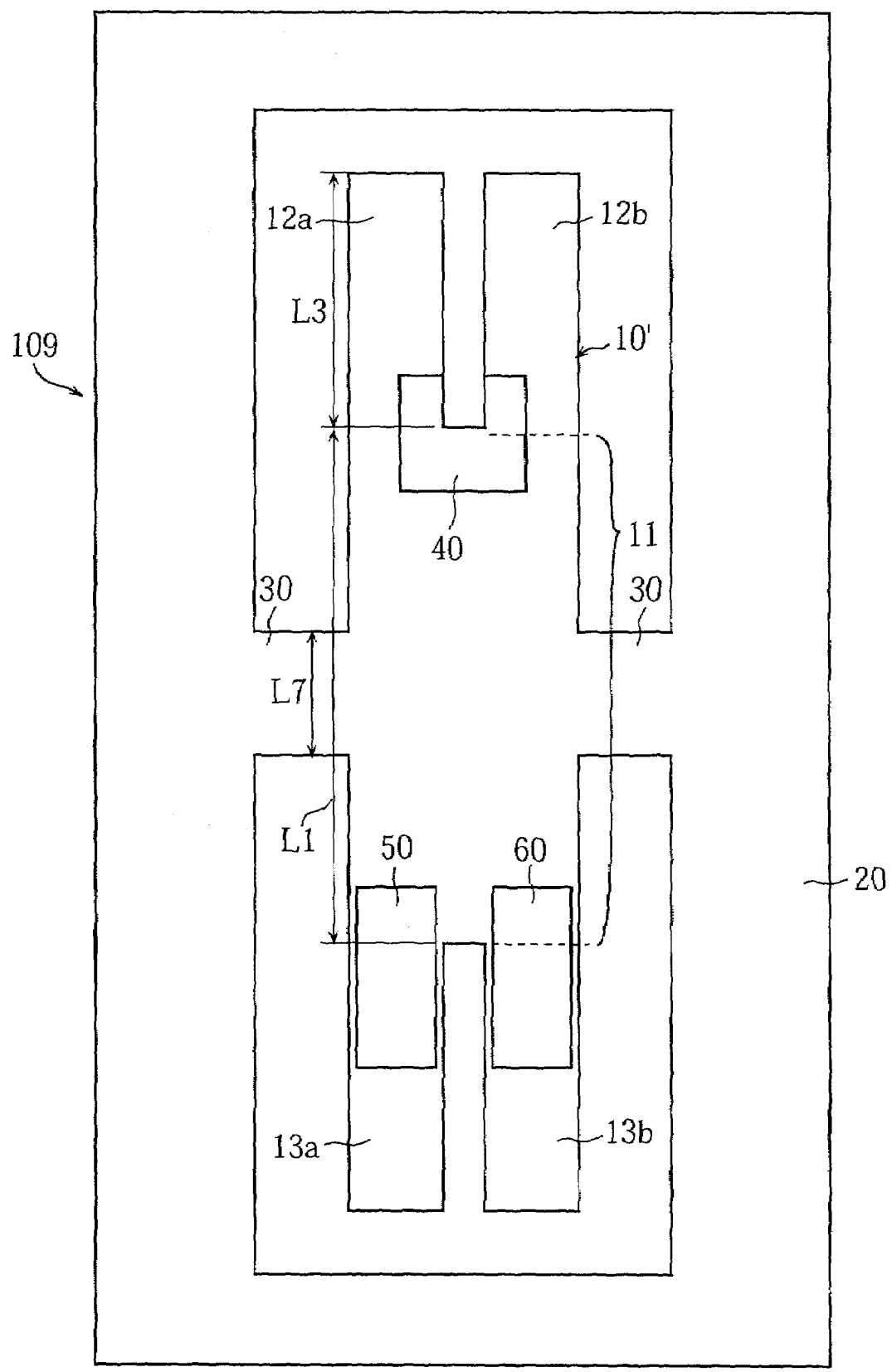
FIG. 24 is a plan view showing an angular velocity sensor according to a ninth embodiment of the present invention.

FIG. 24 shows an angular velocity sensor 109 according to a ninth embodiment of the present invention. The angular velocity sensor 109 has an H-shaped oscillator 10' which is different from the one provided in the angular velocity sensor 101. The H-shaped oscillator 10' includes a support 11, first arms 12*a*, 12*b* and second arms 13*a*, 13*b*, but the arms are shorter than the support 11. More specifically, for example, the length L1 of the support 11 is 3000 μm, whereas the length L3 of the arms is 1500 μm. If the support 11 is made longer than the arm length L3, the support 11 of the H-shaped oscillator 10 has an increased region which is not subjected to a large torsional vibration. This makes it easy to form the torsion bars 30. In other words, since the support 11 is longer than the arms, the torsion bars 30 can be made bigger, which leads to substantial increase in mechanical strength and therefore, improvement in reliability. In the illustrated embodiment, the width L7 of the torsion bars 30 is 800 μm. In the other respects, the ninth embodiment is identical with the angular velocity sensor 101, and therefore no further description will be given for the wiring patterns.

Figure 25:
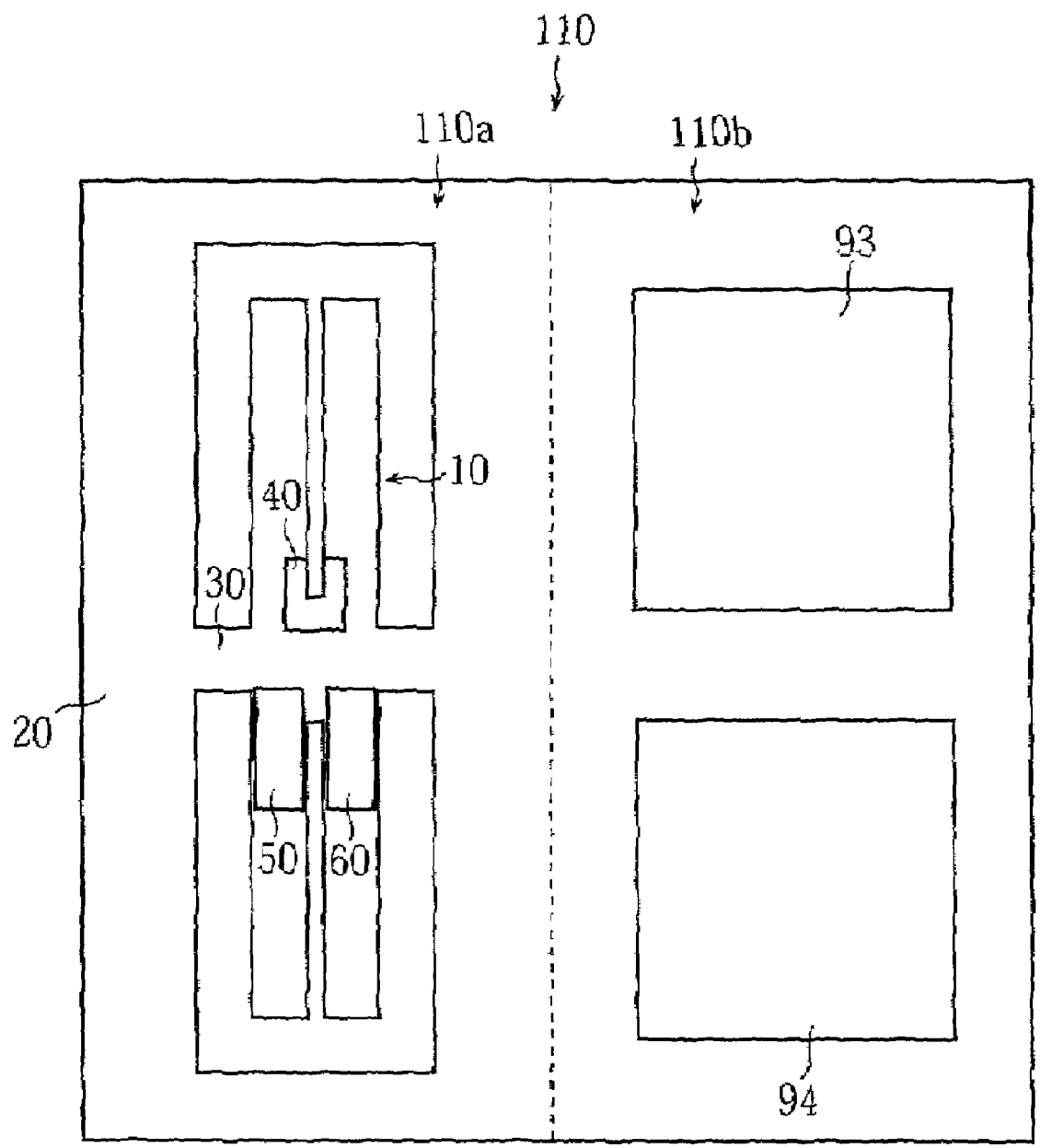
FIG. 25 is a plan view showing an angular velocity sensor according to a tenth embodiment of the present invention.
Figure 26A:
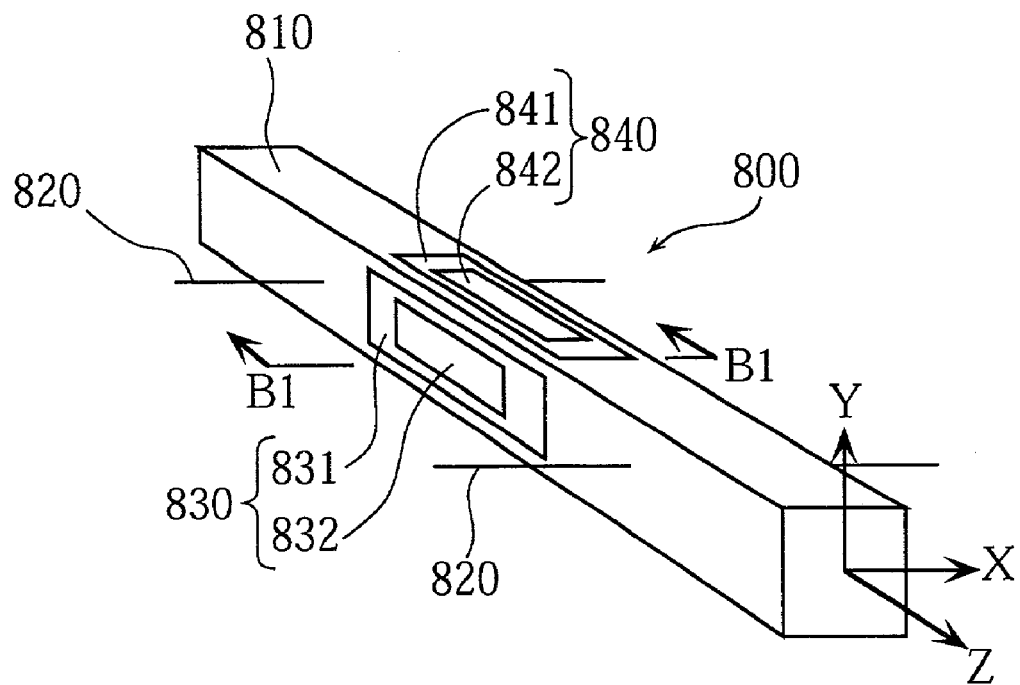
FIG. 26A is a perspective view showing a conventional beam-type angular velocity sensor.
Figure 26B:
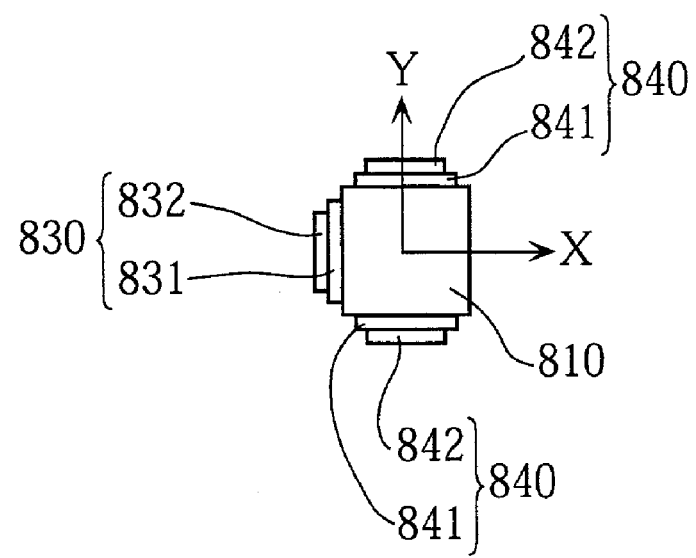
FIG. 26B is a sectional view taken in lines B1—B1 in FIG. 26A.
Figure 27:
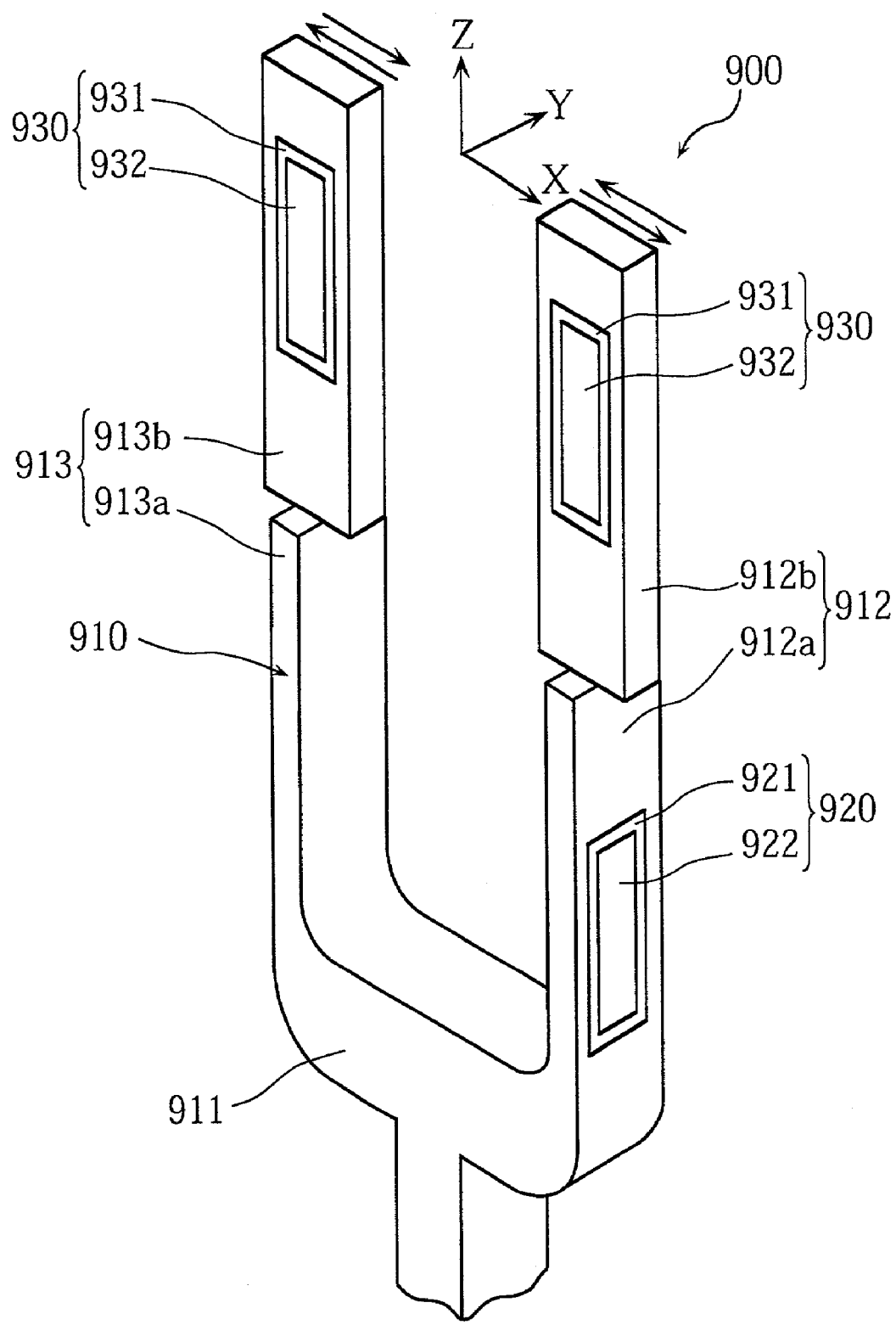
FIG. 27 shows a conventional fork-type angular velocity sensor.

FIG. 25 shows an angular velocity sensor 110 according to a tenth embodiment of the present invention. The angular velocity sensor 110 has its sensor portion 109*a* and circuitry portion 109*b* integrated with each other. The sensor portion 110*a* is the same as of the angular velocity sensor 101. The circuitry portion 110*b* is formed with a driving circuit 93 for driving the driving piezoelectric element 40 of the sensor portion 110*a*, and a detecting circuit 94 as shown in FIG. 7 for example, for detecting signals from the detecting piezoelectric elements 50, 60. More specifically, the silicon substrate prepared for the formation of the H-shaped oscillator 10, the frame 20 and the torsion bars 30 has a region for forming the driving circuit 93 and the detecting circuit 94. Then, this silicon substrate is formed with the H-shaped oscillator 10, the frame 20 and the torsion bars 30 as has been described with reference to FIGS. 9A–9F and FIGS. 11A~11F. Along with this, formation is made for the driving circuit 93, the detecting circuit 94 and wiring patterns necessary for connecting these circuits to the driving piezoelectric element 40 and the detecting piezoelectric elements 50, 60. Such an integration facilitates connection of the sensor portion 110*a* with the driving circuit 93 and the detecting circuit 94.

As described above, the present invention can provide an angular velocity sensor which is highly productive in manufacture, small in size and high in performance.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. An angular velocity sensor comprising:
   a frame;
   an oscillator; and
   a first torsion bar that connects the oscillator to the frame;
   wherein the frame, the oscillator and the torsion bar are formed integral with each other by etching a material substrate in a thickness direction of the substrate;
   wherein the oscillator has an H-like form made up of a support, a pair of first arms and a pair of second arms, the first arms extending from the support in a first arm-extending direction perpendicular to the thickness direction of the substrate to provide a first crotch between the first arms, the second arms extending from the support in a second arm-extending direction opposite to the first direction to provide a second crotch between the second arms;
   wherein the oscillator includes a mounting surface that is provided with a piezoelectric driver for generating in-plane oscillation of the oscillator, and with a piezoelectric detector for detecting out-of-plane oscillation of the oscillator to determine an angular velocity;
   wherein the piezoelectric driver extends on the substrate continuously from one of the first arms onto the support beyond the first crotch and from the support to the other of the first arms beyond the first crotch; and
   wherein the piezoelectric detector extends on the substrate continuously from one of the second arms onto the support beyond the second crotch.

2. The sensor according to claim 1, wherein the torsion bar connects the support of the oscillator and the frame to each other.

3. The sensor according to claim 1, wherein the torsion bar has a thickness no greater than a thickness of the substrate.

4. The sensor according to claim 1, further comprising a second torsion bar that connects the oscillator to the frame, wherein the first and the second torsion bars in combination have a center of gravity that coincides with a center of gravity of the oscillator.

5. The sensor according to claim 1, wherein the piezoelectric driver comprises a plurality of driving piezoelectric elements disposed symmetrically with respect to an imaginary line extending in the arm-extending direction.

6. The sensor according to claim 1, wherein at least one of the piezoelectric driver and the piezoelectric detector includes a first electrode formed on the substrate, a piezoelectric film formed on the first electrode, and a second electrode formed on the piezoelectric film, the piezoelectric film being separate from the substrate and formed by one of vapor deposition, sputtering and printing.

7. The sensor according to claim 1, wherein at least one of the piezoelectric driver and the piezoelectric detector includes a first electrode formed on the substrate, a piezoelectric member provided on the first electrode, and a second electrode, formed on the piezoelectric member, the piezoelectric member being separate from the substrate and formed by mechanical processing.

8. The sensor according to claim 1, wherein the substrate is a low-resistance substrate, at least one of the piezoelectric driver and the piezoelectric detector being provided on the oscillator via an insulating film.

9. The sensor according to claim 1, wherein the substrate is a high-resistance substrate, at least one of the piezoelectric driver and the piezoelectric detector being provided directly on the oscillator without an insulator.

10. The sensor according to claim 1, wherein the arm-extending direction is parallel to the frame, the paired first arms being spaced from each other by a first distance, the paired second arms being spaced from each other by a second distance, the first arms being spaced from the frame by a third distance, the second arms being spaced from the frame by a fourth distance, the first, second, third and fourth distances being equal to each other.

11. The sensor according to claim 1, further comprising a wiring pattern extending on the frame and the torsion bar to connect to at least one of the piezoelectric driver and the piezoelectric detector.

12. The sensor according to claim 1, wherein the substrate is provided with a driving circuit electrically connected to the piezoelectric driver, and with a detecting circuit electrically connected to the piezoelectric detector.

13. The sensor according to claim 1, wherein each of the first arms and the second arms has a tip formed with a thick region.

14. The sensor according to claim 1, wherein each of the first arms and the second arms has a tip provided with a weight.

15. The sensor according to claim 1, wherein the first and the second arms are shorter than the support in the arm-extending direction.

* * * * *